US012443103B2

United States Patent
Nakano et al.

(10) Patent No.: US 12,443,103 B2
(45) Date of Patent: Oct. 14, 2025

(54) CONDUCTIVE COMPOSITION AND METHOD FOR MANUFACTURING SAME, AND CONDUCTOR AND METHOD FOR MANUFACTURING SAME

(71) Applicant: Mitsubishi Chemical Corporation, Tokyo (JP)

(72) Inventors: Saki Nakano, Tokyo (JP); Yoshiko Irie, Tokyo (JP); Masashi Uzawa, Tokyo (JP); Akira Yamazaki, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 610 days.

(21) Appl. No.: 17/244,174

(22) Filed: Apr. 29, 2021

(65) Prior Publication Data

US 2021/0261765 A1    Aug. 26, 2021

Related U.S. Application Data

(63) Continuation of application No. PCT/JP2019/044060, filed on Nov. 11, 2019.

(30) Foreign Application Priority Data

Nov. 15, 2018    (JP) ................. 2018-214904

(51) Int. Cl.
*G03F 7/09* (2006.01)
*B01J 20/291* (2006.01)
(Continued)

(52) U.S. Cl.
CPC ......... *G03F 7/093* (2013.01); *C08G 73/0266* (2013.01); *C08L 25/18* (2013.01);
(Continued)

(58) Field of Classification Search
None
See application file for complete search history.

(56) References Cited

U.S. PATENT DOCUMENTS

| 4,935,163 A | 6/1990 | Cameron |
| 2004/0018240 A1 | 1/2004 | Ohmachi et al. |

(Continued)

FOREIGN PATENT DOCUMENTS

| CN | 103180365 A | 6/2013 |
| CN | 103502359 A | 1/2014 |

(Continued)

OTHER PUBLICATIONS

English machine translation of Sakai et al. (JP 2014-65870 A); PDF accessed online from Espacenet. (Year: 2014).*

(Continued)

*Primary Examiner* — Katie L. Hammer
(74) *Attorney, Agent, or Firm* — Oblon, McClelland, Maier & Neustadt, L.L.P.

(57) ABSTRACT

A conductive composition may include a conductive polymer (A) having an acidic group, and a basic compound (B), wherein: an X/Y area ratio is 0.046 or less, which is a ratio an area (X) of a region corresponding to molecular weight (M) ranging from 300 to 3300, relative to an area (Y) of an entire region ascribed to the conductive polymer (A); or a ZS/ZR ratio is 20 or less. ZS is a maximum fluorescent intensity value in a range of 320 to 420 nm when a fluorescence spectrum is measured at 230 nm excitation wavelength in a solution obtained by diluting the conductive composition with water to adjust the conductive polymer (A) solids content to 0.6 wt. %. ZR is a maximum Raman scattering intensity value in a range of 380 to 420 nm when a fluorescence spectrum of water is measured at 350 nm excitation wavelength.

20 Claims, 1 Drawing Sheet

(51) Int. Cl.

| | |
|---|---|
| *C08G 73/02* | (2006.01) |
| *C08L 25/18* | (2006.01) |
| *C08L 65/00* | (2006.01) |
| *C08L 79/02* | (2006.01) |
| *C08L 101/12* | (2006.01) |
| *C09D 179/02* | (2006.01) |
| *G01N 21/64* | (2006.01) |
| *G01N 21/65* | (2006.01) |
| *G01N 30/86* | (2006.01) |
| *G03F 7/004* | (2006.01) |
| *G03F 7/039* | (2006.01) |
| *G03F 7/40* | (2006.01) |
| *H01B 1/12* | (2006.01) |
| *H01B 1/20* | (2006.01) |
| *H01B 5/14* | (2006.01) |

(52) U.S. Cl.
CPC ............... *C08L 65/00* (2013.01); *C08L 79/02* (2013.01); *C08L 101/12* (2013.01); *C09D 179/02* (2013.01); *G01N 21/64* (2013.01); *G01N 21/65* (2013.01); *G01N 30/8606* (2013.01); *G01N 30/8613* (2013.01); *G03F 7/0045* (2013.01); *G03F 7/0392* (2013.01); *G03F 7/40* (2013.01); *H01B 1/127* (2013.01); *H01B 1/128* (2013.01); *H01B 1/20* (2013.01); *H01B 5/14* (2013.01); *B01J 20/291* (2013.01); *C08L 2201/04* (2013.01); *G01N 2021/6417* (2013.01)

(56) References Cited

U.S. PATENT DOCUMENTS

| | | |
|---|---|---|
| 2013/0209667 A1 | 8/2013 | Yamada et al. |
| 2014/0043731 A1 | 2/2014 | Yamada et al. |
| 2015/0132537 A1 | 5/2015 | Fukuda et al. |
| 2016/0223909 A1 | 8/2016 | Nagasawa et al. |
| 2021/0009818 A1 | 1/2021 | Uzawa et al. |

FOREIGN PATENT DOCUMENTS

| | | | |
|---|---|---|---|
| JP | 8-41320 | A | 2/1996 |
| JP | 8-143664 | A | 6/1996 |
| JP | 2009-62389 | A | 3/2009 |
| JP | 2014-015550 | A | 1/2014 |
| JP | 2014065870 | A * | 4/2014 |
| JP | 2016-124889 | A | 7/2016 |
| JP | 2016-145319 | A | 8/2016 |
| JP | 2017-222831 | A | 12/2017 |
| KR | 10-2016-0094301 | A | 8/2016 |
| KR | 10-2017-0099408 | A | 8/2017 |
| TW | 201413748 | A | 4/2014 |
| WO | WO 2012/144608 | A1 | 10/2012 |
| WO | WO 2014/017540 | A1 | 1/2014 |
| WO | WO 2019/198749 | A1 | 10/2019 |

OTHER PUBLICATIONS

Combined Taiwanese Office Action and Search Report issued Feb. 7, 2023 in Taiwanese Application 108141106, (with English translation), 20 pages.
Korean Office Action issued on Sep. 14, 2022 in Korean Patent Application No. 10-2021-7012849 (with English translation), 9 pages.
European Office Action issued Aug. 9, 2023 in European Application 19 883 862.5, 3 pages.
Japanese Office Action issued Mar. 25, 2022 Japanese Patent Application No. 2020-555673 (with unedited computer generated English translation), 8 pages.
Extended European Search Report issued Feb. 16, 2022 in corresponding European Patent Application No. 19883862.5, 6 pages.
International Search Report issued Jan. 7, 2020 in PCT/JP2019/044060 filed on Nov. 11, 2019 2 pages.
Combined Chinese Office Action and Search Report issued Dec. 2, 2022, in corresponding Chinese Patent Application No. 201980073699.5 (with English Translation), 28 pages.
Office Action issued Dec. 6, 2022, in corresponding Japanese Patent Application No. 2020-555673 (with English Translation), 8 pages.
European Office Action issued Jun. 17, 2025 in European Application 19883862.5 (4 pages).

* cited by examiner

CONDUCTIVE COMPOSITION AND METHOD FOR MANUFACTURING SAME, AND CONDUCTOR AND METHOD FOR MANUFACTURING SAME

CROSS-REFERENCE TO RELATED APPLICATIONS

The present application is a bypass continuation application of International Application No. PCT/JP2019/044060, filed on Nov. 11, 2019, which claims priority to Japanese Patent Application No. 2018-214904, filed Nov. 15, 2018, the entire contents of which are incorporated by reference herein.

TECHNICAL FIELD

The present invention relates to a conductive composition and a method for producing the same, and a conductor and a method for producing the same.

BACKGROUND ART

Patterning techniques using charged particle beams such as electron beams and ion beams are promising candidates of the next generation technology of photolithography. For improving the productivity with the use of charged particle beams, it is important to improve the sensitivity of a resist layer.

From this perspective, the mainstream process uses a highly sensitive chemically amplified resist that is allowed to generate an acid in its area exposed to light or irradiated with the charged particle beam, which is followed by a heat treatment called "post exposure bake (PEB)" to accelerate crosslinking reaction or decomposition reaction.

Further, the recent trend of scale-down of semiconductor devices has made it necessary to manage resist shapes on the order of several namometers.

Incidentally, especially when the substrate is insulative, the patterning method using charged particle beams has a problem that the trajectory of the charged particle beam is bent due to an electric field generated by the charge (charge up) of the substrate, resulting in difficulty in obtaining a desired pattern.

As a means to solve this problem, there is a technique already known to be effective, which applies a conductive composition containing a conductive polymer to a surface of a resist layer to form a coating film so as to coat the surface of the resist layer, thereby imparting an antistatic function to the resist layer.

Polyaniline with an acidic group is known as a conductive polymer. The polyaniline with an acidic group shows conductivity without addition of a dopant.

The polyaniline with an acidic group can be obtained, for example, by polymerization of an aniline having an acidic group by an oxidizing agent in the presence of a basic reaction auxiliary.

However, such a polyaniline with an acidic group is obtained as a reaction mixture containing by-products such as decomposition products of oxidants (e.g., sulfate ions), as well as raw material monomers (unreacted monomers). In addition, the acidic group of such a polyaniline is susceptible to hydrolysis and the like and is unstable, and the acidic group may be eliminated. In particular, when heat is applied to the polyaniline with an acidic group, the acidic group tends to be eliminated or the polyaniline itself tends to be easily decomposed.

Therefore, when the polyaniline with an acidic group is applied to a chemically amplified resist, raw material monomers, decomposition products of polyaniline, eliminated acidic groups, sulfate ions as decomposition products of oxidizing agents, etc. (which are hereinafter, collectively referred to as "acidic substances") easily migrate to the resist layer when the resist layer is subjected to exposure, PEB treatment, and development with a conductive film formed thereon. As a result, the pattern shape and sensitivity can easily change and thus the resist layer is affected.

Specifically, in the case of a positive resist layer, the migration of acidic substances, etc. from the conductive film to the resist layer results in dissolution of the resist layer at its unexposed region during development, causing resist loss of the resist layer, pattern thinning, sensitivity shift to the higher sensitivity-side, and the like.

For addressing this issue, a conductive composition with excellent electrical conductivity and less resist loss of a resist layer is proposed.

For example, Patent Document 1 discloses a conductive composition including a conductive polymer having an acidic group and a basic compound such as tetrabutylammonium hydroxide.

DESCRIPTION OF PRIOR ART

Patent Document

Patent Document 1: International Patent Application Publication No. 2014/017540

DISCLOSURE OF INVENTION

Problems to be Solved by the Invention

However, if the conductive composition contains low molecular weight components that are defect factor components, such components may aggregate and emerge as contaminants on the coating film during film formation. In a coating film with contaminants generated, problems such as line breakage occur after electron beam lithography.

Although the conductive composition described in Patent Document 1 can suppress the migration of acidic substances to the resist layer, there is still room for improvement in reducing the defect factor components.

The present invention has been made in view of the above circumstances, and the object of the present invention is to provide: a conductive composition which is less likely to generate contaminants during the formation of a coating film, and a method for producing the same; and a conductor, and a method for producing the same.

Another object of the present invention is to provide a novel conductive composition different from the conventional compositions, and a method for producing the same.

Means to Solve the Problems

The embodiments of the present invention are as follows.
[1] A conductive composition including a conductive polymer (A) having an acidic group, and a basic compound (B),
wherein an area ratio (X/Y) is 0.046 or less as calculated by an evaluation method including steps (I) to (VI) defined below:
a step (I) of preparing a test solution by dissolving the conductive composition in an eluent having a pH adjusted to 10 or more so as to adjust a solids content of the conductive polymer (A) to 0.1% by mass, a step (II) of measuring a molecular weight distribution of the test solution using a polymer material evaluation device equipped with a gel permeation chromatograph to obtain a chromatogram, a step (III) of converting retention times into sodium polystyrene sulfonate-equivalent molecular weight values (M) with respect to the chromatogram obtained in the step (II), a step (IV) of determining an area (X) of a region corresponding to sodium polystyrene sulfonate-equivalent molecular weight values (M) ranging from 300 to 3300, a step (V) of determining an area (Y) of an entire region ascribed to the conductive polymer (A) in terms of the sodium polystyrene sulfonate-equivalent molecular weight values (M), and a step of (VI) of obtaining an area ratio (X/Y) of the area (X) to the area (Y).

[2] A conductive composition including a conductive polymer (A) having an acidic group, and a basic compound (B), wherein a ratio, ZS/ZR, is 20 or less, wherein the ZS is a maximum value of fluorescence intensity in a wavelength region of 320 to 420 nm when a fluorescence spectrum is measured using a spectrofluorometer at an excitation wavelength of 230 nm with respect to a measurement solution obtained by diluting the conductive composition with water so as to adjust a solids content of the conductive polymer (A) to 0.6% by mass, and the ZR is a maximum value of Raman scattering intensity in a wavelength region of 380 to 420 nm when a fluorescence spectrum of water is measured using a spectrofluorometer at an excitation wavelength of 350 nm.

[3] The conductive composition according to [1] or [2], further including a surfactant (C) and a solvent (D).

[4] A conductor comprising a substrate, and a coating film formed on at least one surface of the substrate by coating the surface with the conductive composition of any one of [1] to [3].

[5] A method for producing a conductor, which includes applying the conductive composition of any one of [1] to [3] to at least one surface of a substrate to form a coating film.

[6] A method for producing a conductive composition, including:

a step of heat-treating a mixed solution containing a conductive polymer (A) having an acidic group and a basic compound (B), and a step of purifying the heat-treated mixed solution so as to have an area ratio (X/Y) of 0.046 or less as calculated by an evaluation method comprising steps (i) to (vi) defined below:

a step (i) of preparing a test solution by dissolving the purified mixed solution in an eluent having a pH adjusted to 10 or more so as to adjust a solids content of the conductive polymer (A) to 0.1% by mass, a step (ii) of measuring a molecular weight distribution of the test solution using a polymer material evaluation device equipped with a gel permeation chromatograph to obtain a chromatogram, a step (iii) of converting retention times into sodium polystyrene sulfonate-equivalent molecular weight values (M) with respect to the chromatogram obtained in the step (ii), a step (iv) of determining an area (X) of a region corresponding to sodium polystyrene sulfonate-equivalent molecular weight values (M) ranging from 300 to 3300, a step (v) of determining an area (Y) of an entire region ascribed to the conductive polymer (A) in terms of the sodium polystyrene sulfonate-equivalent molecular weight values (M), and a step of (vi) of obtaining an area ratio (X/Y) of the area (X) to the area (Y).

[7] A method for producing a conductive composition, including:

a step of heat-treating a mixed solution containing a conductive polymer (A) having an acidic group and a basic compound (B), and a step of purifying the heat-treated mixed solution so as to have a ratio, ZS/ZR, of 20 or less, wherein the ZS is a maximum value of fluorescence intensity in a wavelength region of 320 to 420 nm when a fluorescence spectrum is measured using a spectrofluorometer at an excitation wavelength of 230 nm with respect to a measurement solution obtained by diluting the conductive composition with water so as to adjust a solids content of the conductive polymer (A) to 0.6% by mass, and the ZR is a maximum value of Raman scattering intensity in a wavelength region of 380 to 420 nm when a fluorescence spectrum of water is measured using a spectrofluorometer at an excitation wavelength of 350 nm.

[8] The method according to [6] or [7], further including a step of adding a surfactant (C) and a solvent (D) to the purified mixed solution.

Effect of the Invention

The present invention can provide: a conductive composition which is less likely to generate contaminants during the formation of a coating film, and a method for producing the same; and a conductor, and a method for producing the same.

Also, the present invention can provide a novel conductive composition different from the conventional compositions, and a method for producing the same.

DESCRIPTION OF THE EMBODIMENTS

Figure 1:
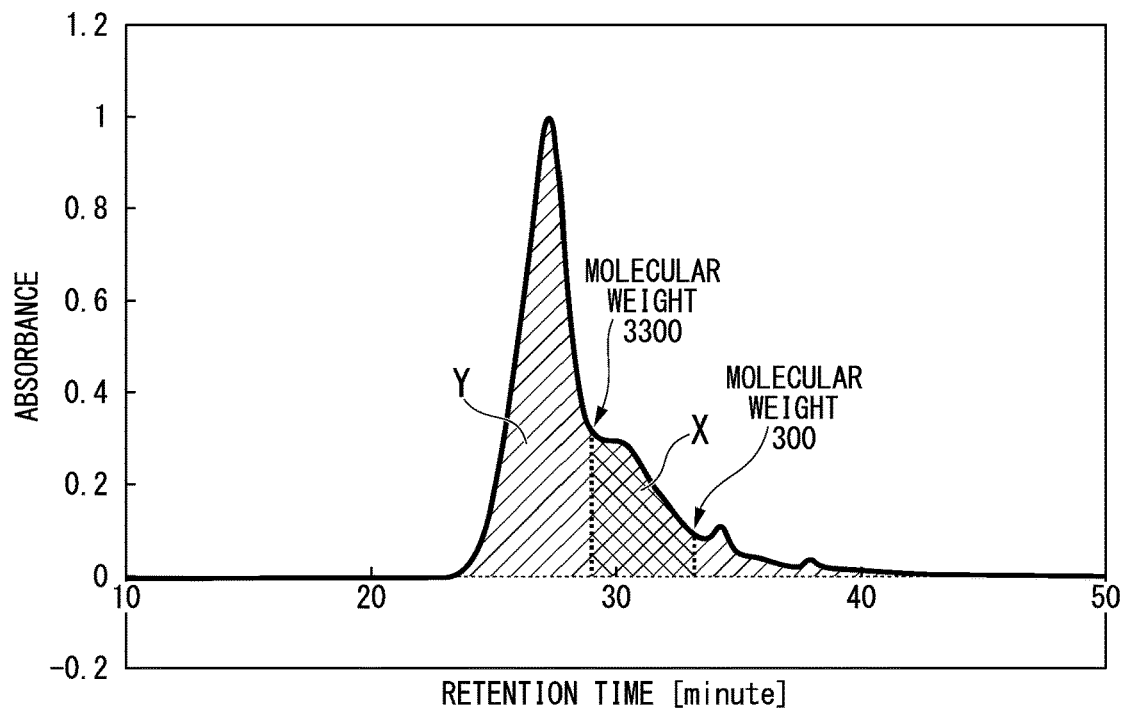
FIG. 1 shows an example of a chromatogram obtained by gel permeation chromatography in step (II) of the evaluation method.

Hereinbelow, the present invention will be described in detail. The following embodiments are mere examples to illustrate the invention and are not intended to limit the invention to these embodiments. The present invention can be implemented in various embodiments as long as such embodiments do not deviate from the gist of the present invention.

In the present invention, the term "conductive" means that a surface resistivity is $1 \times 10^{10}$ Ω/sq. or less. The surface resistivity is determined from the potential difference between electrodes when a constant current is flown between the electrodes.

Further, in the context of the present specification, the term "solubility" means that 0.1 g or more of a substance dissolves uniformly in 10 g (liquid temperature 25° C.) of at least one solvent selected from simple water, water containing at least one of a base and a basic salt, water containing an acid, and a mixture of water and a water-soluble organic solvent. Furthermore, the term "water-soluble" means the solubility in water in relation to the aforementioned solubility.

Further, in the context of the present specification, the "acidic substance" means a substance having a negative charge, specifically, raw material monomers of the conductive polymer (A), decomposition products of the conductive polymer (A), acidic groups eliminated from the conductive polymer (A) (free acidic groups), and decomposition products of an oxidizing agent used in the production of the conductive polymer (A) (for example, sulfate ions).

In the context of the present specification, the "terminal" of the "terminal hydrophobic group" means a site other than repeating units constituting a polymer.

Further, in the context of the present specification, the term "mass average molecular weight" refers to a mass average molecular weight (in terms of sodium polystyrene sulfonate) as measured by gel permeation chromatography (GPC).

[Conductive Composition]

First Embodiment

The conductive composition of the first embodiment of the present invention includes a conductive polymer (A), and a basic compound (B), which are described below. The conductive composition preferably further contains a surfactant (C) or a solvent (D), which are described below.

(Conductive Polymer (A))

The conductive polymer (A) has an acidic group. When the conductive polymer (A) has an acidic group, the water solubility can be enhanced. As a result, the coatability of the conductive composition is enhanced, and it becomes easy to obtain a coating film having a uniform thickness.

The conductive polymer having an acidic group is not particularly limited as long as it has at least one group selected from the group consisting of a sulfonic acid group and a carboxy group in its molecule and the effect of the present invention is achieved. Any known conductive polymers can be used. Examples of the conductive polymer preferable from the perspective of solubility include conductive polymers described in Japanese Patent Unexamined Publication Nos. Sho 61-197633, Sho 63-39916, Hei 1-301714, Hei 5-504153, Hei 5-503953, Hei 4-32848, Hei 4-328181, Hei 6-145386, Hei 6-56987, Hei 5-226238, Hei 5-178989, Hei 6-293828, Hei 7-118524, Hei 6-32845, Hei 6-87949, Hei 6-256516, Hei 7-41756, Hei 7-48436, Hei 4-268331, and 2014-65898.

Specific examples of the conductive polymer having an acidic group include π-conjugated conductive polymers containing, as repeating units, at least one type of monomers selected from the group consisting of phenylene vinylene, vinylene, thienylene, pyrrolylene, phenylene, iminophenylene, isothianaphthene, furylene, and carbazolylene, each having its α position or β position substituted with at least one group selected from the group consisting of a sulfonic acid group and a carboxy group.

When the π-conjugated conductive polymer contains at least one repeating unit selected from the group consisting of iminophenylene and carbazolylene, examples thereof include a conductive polymer having at least one group selected from the group consisting of a sulfonic acid group and a carboxy group on the nitrogen atoms of the repeating units, and a conductive polymer having an alkyl group (or an ether bond-containing alkyl group) substituted with at least one group selected from the group consisting of a sulfonic acid group and a carboxy group on the nitrogen atoms of the repeating units.

Among these, from the perspective of conductivity and solubility, it is preferable to use conductive polymers having at least one type of monomer unit selected from the group consisting of thienylene, pyrrolylene, iminophenylene, phenylenevinylene, carbazolylene, and isothianaphthene, each having its β position substituted with at least one group selected from the group consisting of a sulfonic acid group and a carboxy group.

For obtaining high conductivity and solubility, the conductive polymer (A) is preferably a conductive polymer containing 20 to 100 mol % of one or more monomer units selected from the group consisting of units represented by the following formulae (1) to (4), based on the total units (100 mol %) constituting the conductive polymer.

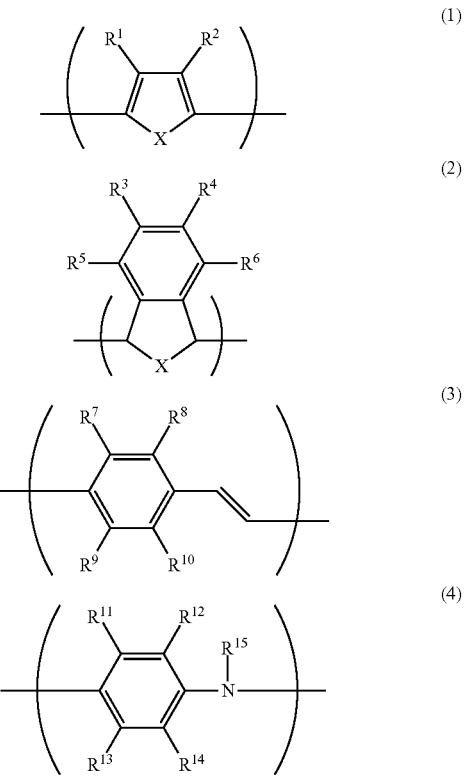

In the formulae (1) to (4), X represents a sulfur atom or a nitrogen atom, and each of $R^1$ to $R^{15}$ independently represents a hydrogen atom, a linear or branched alkyl group having 1 to 24 carbon atoms, a linear or branched alkoxy group having 1 to 24 carbon atoms, an acidic group, a hydroxy group, a nitro group, a halogen atom (—F, —Cl— Br or —I), —N($R^{16}$)$_2$, —NHCOR$^{16}$, —SR$^{16}$, —OCOR$^{16}$, —COOR$^{16}$, —COR$^{16}$, —CHO or —CN. R$^{16}$ is preferably an alkyl group having 1 to 24 carbon atoms, an aryl group having 6 to 24 carbon atoms, or an aralkyl group having 7 to 24 carbon atoms.

However, at least one of R$^1$ and R$^2$ in the formula (1), at least one of R$^3$ to R$^6$ in the formula (2), at least one of R$^7$ to R 10 in the formula (3), and at least one of R$^{11}$ to R$^{15}$ in the formula (4) are each an acidic group or a salt thereof.

In this context, the "acidic group" means a sulfonic acid group (sulfo group) or a carboxylic acid group (carboxy group).

The sulfonic acid group may be present in an acid form (—SO$_3$H) or an ionic form (—SO$_3^-$). Further, the sulfonic acid group also encompasses a substituent having a sulfonic acid group (—R$^{17}$SO$^3$H).

On the other hand, the carboxylic acid group may be present in an acid form (—COOH) or an ionic form (—COO$^-$). Further, the carboxylic acid group also encompasses a substituent having a carboxylic acid group (—R$^{17}$COOH).

R$^{17}$ represents a linear or branched alkylene group having 1 to 24 carbon atoms, a linear or branched arylene group having 6 to 24 carbon atoms, or a linear or branched aralkylene group having 7 to 24 carbon atoms.

Examples of the salt of acidic group include alkali metal salts, alkaline earth metal salts, ammonium salts, and substituted ammonium salts of a sulfonic acid group or a carboxylic acid group.

Examples of the alkali metal salt include lithium sulfate, lithium carbonate, lithium hydroxide, sodium sulfate, sodium carbonate, sodium hydroxide, potassium sulfate, potassium carbonate, potassium hydroxide and derivatives having skeletons thereof.

Examples of the alkaline earth metal salt include magnesium salts, calcium salts and the like.

Examples of the substituted ammonium salt include aliphatic ammonium salts, saturated alicyclic ammonium salts, unsaturated alicyclic ammonium salts and the like.

Examples of the aliphatic ammonium salts include methyl ammonium, dimethyl ammonium, trimethyl ammonium, ethyl ammonium, diethyl ammonium, triethyl ammonium, methyl ethyl ammonium, diethyl methyl ammonium, dimethyl ethyl ammonium, propyl ammonium, dipropyl ammonium, isopropyl ammonium, diisopropyl ammonium, butyl ammonium, dibutyl ammonium, methyl propyl ammonium, ethyl propyl ammonium, methyl isopropyl ammonium, ethyl isopropyl ammonium, methyl butyl ammonium, ethyl butyl ammonium, tetramethyl ammonium, tetramethylol ammonium, tetra ethyl ammonium, tetra n-butyl ammonium, tetra sec-butyl ammonium, tetra t-butyl ammonium, and the like.

Examples of the saturated alicyclic ammonium salt include piperidinium, pyrrolidinium, morpholinium, piperazinium, and derivatives having skeletons thereof. Examples of the unsaturated alicyclic ammonium salt include pyridinium, α-picolinium, β-picolinium, γ-picolinium, quinolinium, isoquinolinium, pyrrolinium, and derivatives having skeletons thereof.

The conductive polymer (A) preferably has a monomer unit represented by the above formula (4) since high conductivity can be achieved. Among the monomer units represented by the above formula (4), from the perspective of excellent solubility, especially preferred is a monomer unit represented by the following formula (5).

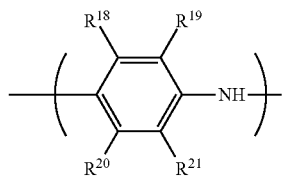

(5)

In the formula (5), each of R$^{18}$ to R$^{21}$ independently represents a hydrogen atom, a linear or branched alkyl group having 1 to 24 carbon atoms, a linear or branched alkoxy group having 1 to 24 carbon atoms, an acidic group, a hydroxy group, a nitro group or a halogen atom (—F, —Cl—Br or —I), with the proviso that at least one of R$^{18}$ to R$^{21}$ is an acidic group or a salt thereof.

As for the monomer unit represented by the above formula (5), it is preferable in terms of easy production that any one of R$^{18}$ to R$^{21}$ is a linear or branched alkoxy group having 1 to 4 carbon atoms, while another one of R$^{18}$ to R$^{21}$ is a sulfonic acid group, and the remainder is hydrogen.

From the viewpoint of excellent solubility in water and organic solvents regardless of pH, the conductive polymer (A) preferably contain a monomer unit represented by the formula (5) in an amount of 10 to 100 mol %, more preferably 50 to 100 mol %, and particularly preferably 100 mol %, of all the monomer units (100 mol %) constituting the conductive polymer (A).

Further, the conductive polymer (A) preferably contains 10 or more of the monomer unit represented by the formula (5) per one molecule from the viewpoint of excellent conductivity.

In the conductive polymer (A), for further improving solubility, the number of acidic group-bonded aromatic rings is preferably 50% or more, more preferably 70% or more, even more preferably 80% or more, particularly preferably 90% or more, and most preferably 100%, relative to the total number of aromatic rings present in the polymer.

The number of acidic group-bonded aromatic rings relative to the total number of aromatic rings present in the polymer refers to a value calculated from the compounding ratio of monomers at the production of the conductive polymer (A).

Further, with respect to substituents on the aromatic rings of the monomer units in the conductive polymer (A), the substituents other than the acidic group are preferably electron donating groups for imparting reactivity to the monomers. Specifically, such substituents are preferably alkyl groups having 1 to 24 carbon atoms, alkoxy groups having 1 to 24 carbon atoms, halogen groups (—F, —Cl, —Br or —I) and the like, and alkoxy groups having 1 to 24 carbon atoms are most preferable from the perspective of electron donation.

Further, the conductive polymer (A) may contain, as constituent units other than those represented by the formula (5), one or more units selected from the group consisting of aniline, thiophene, pyrrole, phenylene, vinylene, a divalent unsaturated group and a divalent saturated group, which may be substituted or unsubstituted, as long as such units do not affect the solubility, conductivity and properties.

The conductive polymer (A) is preferably a compound having a structure represented by the following formula (6) since high conductivity and solubility can be achieved. Among the compounds having a structure represented by the formula (6), poly(2-sulfo-5-methoxy-1,4-iminophenylene) is particularly preferable.

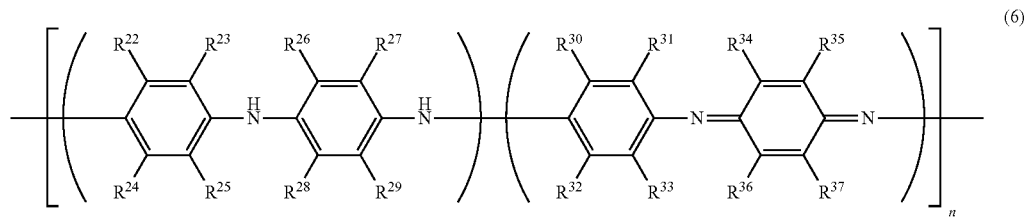

In the formula (6), each of $R^{22}$ to $R^{37}$ independently represents a hydrogen atom, a linear or branched alkyl group having 1 to 4 carbon atoms, a linear or branched alkoxy group having 1 to 4 carbon atoms, an acidic group, a hydroxy group, a nitro group or a halogen atom (—F, —Cl, —Br or —I). At least one of $R^{22}$ to $R^{37}$ is an acidic group or a salt thereof. Further, n represents a polymerization degree. In the present invention, n is preferably an integer of 5 to 2500.

It is desirable that at least a part of the acidic groups possessed by the conductive polymer (A) is in a free acid form from the perspective of conductivity improvement.

From the perspective of conductivity, solubility and film formability, the mass average molecular weight of the conductive polymer (A) is preferably 1,000 to 1,000,000, more preferably 1,500 to 800,000, still more preferably 2,000 to 500,000, and particularly preferably 2,000 to 100,000, in terms of sodium polystyrene sulfonate as determined by GPC. When the mass average molecular weight of the conductive polymer (A) is less than 1000, good solubility may be achieved, but the conductivity and the film formability may be insufficient. On the other hand, when the mass average molecular weight exceeds 1,000,000, good conductivity may be achieved, but the solubility may be insufficient.

The term "film formability" refers to an ability to form a uniform film without cissing, etc., which can be evaluated by a method such as spin coating on glass.

As for the method for producing the conductive polymer (A), there is no particular limitation and any known method can be employed as long as the desired effect of the present invention is available.

Specific examples of the method include a method of polymerizing polymerizable monomers (raw material monomers) capable of forming any of the above monomer units by various synthesis methods such as a chemical oxidation method, an electrolytic oxidation method and the like. As such method, for example, the synthesis methods described in Japanese Unexamined Patent Application Publication Nos. Hei 7-196791 and Hei 7-324132 can be adopted.

An example of method for producing the conductive polymer (A) is described below.

For example, the conductive polymer (A) can be obtained by polymerizing raw material monomers using an oxidizing agent in the presence of a basic reaction auxiliary.

Specific examples of the raw material monomer include at least one selected from the group consisting of an acidic group-substituted aniline, an alkali metal salt thereof, an alkaline earth metal salt thereof, an ammonium salt thereof, and a substituted ammonium salt thereof.

Examples of the acidic group-substituted aniline include a sulfonic acid group-substituted aniline having a sulfonic acid group as an acidic group.

Representative examples of the sulfonic acid group-substituted aniline include aminobenzene sulfonic acids. Specific examples of the aminobenzene sulfonic acids which are preferably used include o-, m-, p-aminobenzene sulfonic acids, aniline-2,6-disulfonic acid, aniline-2,5-disulfonic acid, aniline-3,5-disulfonic acid, aniline-2,4-disulfonic acid, aniline-3,4-disulfonic acid and the like.

Examples of the sulfonic acid group-substituted aniline other than aminobenzene sulfonic acids include alkyl group-substituted aminobenzene sulfonic acids such as methyl aminobenzene sulfonic acid, ethyl aminobenzene sulfonic acid, n-propylaminobenzene sulfonic acid, iso-propylaminobenzene sulfonic acid, n-butylaminobenzene sulfonic acid, sec-butylaminobenzene sulfonic acid and t-butyl aminobenzene sulfonic acid; alkoxy group-substituted aminobenzene sulfonic acids such as methoxyaminobenzene sulfonic acid, ethoxyaminobenzene sulfonic acid and propoxyaminobenzene sulfonic acid; hydroxy group-substituted aminobenzene sulfonic acids; nitro group-substituted aminobenzene sulfonic acids; and halogen-substituted aminobenzene sulfonic acids such as fluoroaminobenzene sulfonic acid, chloroaminobenzene sulfonic acid and bromaminobenzene sulfonic acid.

Among these, alkyl group-substituted aminobenzene sulfonic acids, alkoxy group-substituted aminobenzene sulfonic acids, hydroxy group-substituted aminobenzene sulfonic acids, or halogen-substituted aminobenzene sulfonic acids are preferable in that a conductive polymer (A) having particularly excellent conductivity and solubility can be obtained, and alkoxy group-substituted aminobenzenesulfonic acids, alkali metal salts, ammonium salts and substituted ammonium salts thereof are particularly preferable in respect of easy production.

One of these sulfonic acid group-substituted anilines may be used alone, or two or more of them may be used in the form of a mixture thereof with an appropriate blending ratio.

Examples of the basic reaction auxiliary include inorganic bases such as sodium hydroxide, potassium hydroxide, and lithium hydroxide; ammonia; fatty amines such as methylamine, dimethylamine, trimethylamine, ethylamine, diethylamine, triethylamine, ethylmethylamine, ethyldimethylamine, and diethylmethylamine; cyclic saturated amines; cyclic unsaturated amines such as pyridine, α-picoline, β-picoline, γ-picoline, and quinoline.

Among these, inorganic bases, fatty amines, and cyclic unsaturated amines are preferable, and inorganic bases are more preferable.

One of these basic reaction auxiliaries may be used alone, or two or more of them may be used in the form of a mixture thereof with an appropriate blending ratio.

The oxidizing agent is not limited as long as it has a standard electrode potential of 0.6 V or more, and examples thereof include peroxodisulfates such as peroxodisulfuric acid, ammonium peroxodisulfate, sodium peroxodisulfate, and potassium peroxodisulfate; and hydrogen peroxide.

Any one of these oxidizing agents may be used alone, or two or more thereof may be mixed and used at an arbitrary ratio.

Examples of the polymerization method includes a method of dropping a mixture of raw material monomers and a basic reaction auxiliary into an oxidant solution, a method of dropping an oxidant solution into a mixture of raw material monomers and a basic reaction auxiliary, and a method of dropping a mixture of raw material monomers and a basic reaction auxiliary as well as an oxidant solution into a reaction vessel simultaneously.

After the polymerization, the solvent is usually separated by a separation device such as a centrifugal separator. The conductive polymer (A) is obtained by drying the filtered material after washing with a washing solution if necessary.

The acidic groups of the conductive polymer (A) thus obtained are groups selected from the group consisting of free acids, alkali metal salts, alkaline earth metal salts, ammonium salts and substituted ammonium salts. Therefore, it is possible to obtain a polymer in which different types of the groups are present, instead of a single type of the group.

For example, when sodium hydroxide is used as the basic reaction auxiliary during polymerization, most of the acidic groups of the conductive polymer (A) are present in the form of sodium salts. When ammonia is used as the basic reaction auxiliary, most of the acidic groups of the conductive polymer (A) are present in the form of ammonium salts. When trimethylamine is used, most of the acidic groups of the conductive polymer (A) are present in the form of trimethylammonium salts. When quinoline is used, most of the acidic groups of the conductive polymer (A) are present in the form of quinolinium salts.

The conductive polymer (A) thus obtained may contain low molecular weight components such as oligomers formed by side reactions, acidic substances, basic substances (such as a basic reaction auxiliary and ammonium ions as decomposition products of oxidizing agents). These low molecular weight components are factors that inhibit conductivity.

Therefore, it is preferable to purify the conductive polymer (A) to remove the low molecular weight components.

The method for purifying the conductive polymer (A) is not particularly limited, any purification methods can be employed, such as ion exchange method, acid cleaning in a protonic acid solution, removal by heat treatment, and neutralization and precipitation. Among these, the ion exchange method is particularly effective because a highly-purified conductive polymer (A) can be obtained with ease.

The ion exchange method enables efficient removal of basic substances existing in the form of salts formed with the acidic group of the conductive polymer (A), acidic substances, and the like, so that the conductive polymer (A) having high purity can be obtained.

Examples of the ion exchange method include a column- or batch-treatment using ion exchange resins such as cation exchange resins or anion exchange resins; electrodialysis methods, etc.

When the conductive polymer (A) is purified by the ion exchange method, it is preferable to dissolve a reaction mixture obtained by the polymerization in an aqueous medium to a desired solids content, and then allow the resulting polymer solution to contact an ion exchange resin.

The aqueous medium may be the same as mentioned for the solvent (D) described below.

The concentration of the conductive polymer (A) in the polymer solution is preferably 0.1 to 20% by mass, and more preferably 0.1 to 10% by mass from the viewpoint of industrial efficiency and purification efficiency.

When implementing the ion exchange method using an ion exchange resin with respect to a polymer solution having a solids content of, for example, 5% by mass, the amount of the sample solution relative to the ion exchange resin is preferably up to 10 times, more preferably up to 5 times the volume of the ion exchange resin. Examples of the cation exchange resin include "Amberlite IR-120B" manufactured by Organo Corporation. Examples of the anion exchange resin include "Amberlite IRA410" manufactured by Organo Corporation.

The conductive polymer (A) purified in this manner exhibits more excellent conductivity because oligomers, acidic substances, basic substances and the like are sufficiently removed. The conductive polymer (A) after purification is in a state of being dispersed or dissolved in an aqueous medium. Therefore, a solid form of the conductive polymer (A) can be obtained by entirely removing the aqueous medium with an evaporator or the like, but the conductive polymer (A) in a state of being dispersed or dissolved in an aqueous medium as such may also be used for production of the conductive composition.

The amount of the conductive polymer (A), based on a total mass of the conductive composition, is preferably 0.1 to 5% by mass, more preferably 0.2 to 3% by mass, and even more preferably 0.5 to 2% by mass.

The amount of the conductive polymer (A), based on a total mass of solid components of the conductive composition, is preferably 50 to 99.9% by mass, more preferably 80 to 99.9% by mass, and even more preferably 95 to 99.9% by mass. The solid components of the conductive composition are a residue obtained by removing the solvent (D) from the conductive composition.

When the amount of the conductive polymer (A) is within the range described above, an excellent balance is achieved between the coatability of the conductive composition and the conductivity of a coating film formed from the conductive composition.

(Basic Compound (B))

The presence of the basic compound (B) in the conductive composition is considered to enable the improvement of stability of the conductive polymer (A) because the basic compound (B) efficiently acts on the acidic group in the conductive polymer (A). In this context, efficiently acting on the acidic group in the conductive polymer (A) means that stable neutralization of the conductive polymer (A) is enabled, and the acidic group of the conductive polymer (A) and the basic compound (B) together form a stable salt. That is, the conductive polymer (A) is neutralized with the basic compound (B). As a result, the destabilization of the acidic group of the conductive polymer (A) due to hydrolysis in the conductive composition can be suppressed, and the acidic group is less likely to be eliminated. In addition, by forming a stable salt between the acidic group of the conductive polymer (A) and the basic compound (B), the decomposition of the conductive polymer (A) itself can be suppressed. The basic compound (B) also forms stable salts with decomposition products (for example, sulfate ions) of the oxidizing agent used in the production of the conductive polymer (A). Therefore, it is possible to suppress the generation of acidic groups derived from the conductive polymer (A) and sulfate ions derived from the oxidizing agent in the conductive composition. In addition, the amount of the decomposition products of the conductive polymer (A) in the conductive composition can be reduced as well.

Therefore, particularly in the patterning method with a charged particle beam using a chemically amplified resist, the migration of the acidic substances from the conductive film to the resist layer can be suppressed, thereby reducing undesirable consequences such as the resist loss of the resist layer.

The basic compound (B) is not particularly limited as long as it is a compound showing basicity, and examples thereof include the following quaternary ammonium compound (b-1), basic compound (b-2), and basic compound (b-3).

Quaternary ammonium compound (b-1): a quaternary ammonium compound in which at least one of the four substituents bonded to the nitrogen atom is a hydrocarbon group having 1 or more carbon atoms.

Basic compound (b-2): a basic compound having one or more nitrogen atoms (exclusive of the quaternary ammonium compound (b-1) and the basic compound (b-3)).

Basic compound (b-3): a basic compound having a basic group and two or more hydroxy groups in the same molecule and a melting point of 30° C. or higher.

In the quaternary ammonium compound (b-1), the nitrogen atom to which the four substituents are bonded is a nitrogen atom of the quaternary ammonium ion.

Examples of the hydrocarbon group bonded to the nitrogen atom of the quaternary ammonium ion in the compound (b-1) include an alkyl group, an aralkyl group and an aryl group.

Examples of the quaternary ammonium compound (b-1) include tetramethylammonium hydroxide, tetraethylammonium hydroxide, tetrapropylammonium hydroxide, tetrabutylammonium hydroxide, tetrapentylammonium hydroxide, tetrahexylammonium hydroxide, benzyltrimethylammonium hydroxide, and the like.

Examples of the basic compound (b-2) includes ammonia, pyridine, triethylamine, 4-dimethylaminopyridine, 4-dimethylaminomethylpyridine, 3,4-bis(dimethylamino)pyridine, 1,5-diazabicyclo[4.3.0]-5-nonene (DBN), 1,8-diazabicyclo[5.4.0]-7-undecene (DBU), and derivatives thereof.

In the basic compound (b-3), the basic group may be, for example, a basic group defined as an Arrhenius base, a Brønsted base, a Lewis base, etc. Specific examples include ammonia, etc. The hydroxy group may be in the state of —OH or may be protected by a protective group. Examples of the protective groups include an acetyl group; a silyl group such as a trimethyl silyl group, a tert-butyl dimethyl silyl group, etc.; an acetal-type protective group such as a methoxymethyl group, an ethoxymethyl group, a methoxyethoxymethyl group, etc.; a benzoyl group; an alkoxide group, etc.

Examples of the basic compound (b-3) includes 2-amino-1,3-propanediol, tris(hydroxymethyl)aminomethane, 2-amino-2-methyl-1,3-propanediol, 2-amino-2-ethyl-1,3-propanediol, 3-[N-tris(hydroxymethyl)methylamino]-2-hydroxypropanesulfonic acid, and N-tris(hydroxymethyl)methyl-2-aminoethanesulfonic acid.

One of these basic compounds may be used alone, or two or more of them may be used in the form of a mixture thereof with an appropriate blending ratio.

Among those mentioned above, the basic compound (B) preferably includes at least one selected from the group consisting of the quaternary ammonium salt (b-1) and the basic compound (b-2) because the formation of a salt with the acidic group of the conductive polymer (A) is facilitated, thereby stabilizing the acidic group to achieve excellent effect of preventing acidic substances derived from the coating film from affecting the resist pattern.

For further improving the coatability of the conductive composition, the amount of the basic compound (B) is preferably 0.1 to 1 mol equivalent, and preferably 0.1 to 0.9 mol equivalent, with respect to 1 mol of the unit having an acidic group among the units constituting the conductive polymer (A). Further, the amount is particularly preferably 0.25 to 0.85 mol equivalent for achieving excellent retention of performance as a conductive film and further increasing stability of the acidic group in the conductive polymer (A).

(Surfactant (C))

When the conductive composition contains a surfactant, the coatability exhibited when the conductive composition is applied to the surface of a substrate or a resist layer can be improved.

Examples of the surfactant include anionic surfactants, cationic surfactants, amphoteric surfactants, nonionic surfactants and the like. Any one of these surfactants may be used alone, or two or more thereof may be mixed and used at an arbitrary ratio.

Examples of the anionic surfactant include sodium octanoate, sodium decanoate, sodium laurate, sodium myristate, sodium palmitate, sodium stearate, perfluorononanoic acid, sodium N-lauroylsarcosinate, sodium cocoyl glutamate, α-sulfo fatty acid methyl ester salt, sodium lauryl sulfate, sodium myristyl sulfate, sodium laureth sulfate, sodium polyoxyethylene alkylphenol sulfonate, ammonium lauryl sulfate, lauryl phosphate, sodium lauryl phosphate, and potassium lauryl phosphate.

Examples of the cationic surfactant include tetramethylammonium chloride, tetramethylammonium hydroxide, tetrabutylammonium chloride, dodecyldimethylbenzylammonium chloride, an alkyltrimethylammonium chloride, octyltrimethylammonium chloride, decyltrimethylammonium chloride, dodecyltrimethylammonium chloride, tetradecyltrimethylammonium chloride, cetyltrimethylammonium chloride, stearyltrimethylammonium chloride, an alkyltrimethylammonium bromide, hexadecyltrimethylammonium bromide, benzyltrimethylammonium chloride, benzyltriethylammonium chloride, benzalkonium chloride, benzalkonium bromide, benzethonium chloride, a dialkyldimethylammonium chloride, didecyldimethylammonium chloride, distearyldimethylammonium chloride, monomethylamine hydrochloride, dimethylamine hydrochloride, trimethylamine hydrochloride, butylpyridinium chloride, dodecylpyridinium chloride, and cetylpyridinium chloride.

Examples of the amphoteric surfactant include betaine lauryldimethylaminoacetate, betaine stearyldimethylaminoacetate, dodecylaminomethyldimethylsulfopropylbetaine, octadecylaminomethyldimethylsulfopropylbetaine, cocamidopropylbetaine, cocamidopropylhydroxysultaine, a 2-alkyl-N-carboxymethyl-N-hydroxyethylimidazolinium betaine, sodium lauroylglutamate, potassium lauroylglutamate, lauroylmethyl-β-alanine, lauryldimethylamine-N-oxide, and oleyldimethylamine N-oxide.

Examples of the nonionic surfactants include glyceryl laurate, glyceryl monostearate, a sorbitan fatty acid ester, a sucrose fatty acid ester, a polyoxyethylene alkyl ether, pentaethylene glycol monododecyl ether, octaethylene glycol monododecyl ether, a polyoxyethylene alkylphenyl ether, octylphenol ethoxylate, nonylphenol ethoxylate, polyoxyethylene polyoxypropylene glycol, a polyoxyethylene sorbitan fatty acid ester, a polyoxyethylene hexitan fatty acid ester, a sorbitan fatty acid ester polyethylene glycol, lauric acid diethanolamide, oleic acid diethanolamide, stearic acid diethanolamide, octyl glucoside, decyl glucoside, lauryl glucoside, cetanol, stearyl alcohol, and oleyl alcohol.

In addition to those listed above, a water-soluble polymer having a nitrogen-containing functional group and a terminal hydrophobic group may be used as the nonionic surfactant. Unlike conventional surfactants, such a water-soluble polymer shows a surface activity due to a main chain portion (hydrophilic portion) having a nitrogen-containing functional group and a hydrophobic group portion at the molecular terminal, and is highly effective for improving coatability. Therefore, excellent coatability can be imparted to the conductive composition even without using other surfactants in combination. Moreover, since this water-soluble polymer does not contain acids or bases and is less likely to generate by-products through hydrolysis, the adverse effect on the resist layer and the like is particularly small.

As the nitrogen-containing functional group, an amide group is preferable from the perspective of solubility.

Examples of the terminal hydrophobic groups include alkyl groups, aralkyl groups, aryl groups, alkoxy groups, aralkyloxy groups, aryloxy groups, alkylthio groups, aralkylthio groups, arylthio groups, primary or secondary alkylamino groups, aralkylamino groups, and arylamino groups. Among these, an alkylthio group, an aralkylthio group and an arylthio group are preferable.

The number of carbon atoms of the terminal hydrophobic group is preferably 3 to 100, more preferably 5 to 50, and particularly preferably 7 to 30.

The number of terminal hydrophobic groups in the water-soluble polymer is not particularly limited. Further, when two or more terminal hydrophobic groups are contained in the same molecule, the terminal hydrophobic groups may be of the same type or different types.

The water-soluble polymer is preferably a compound having a main chain structure formed of a homopolymer of vinyl monomers having a nitrogen-containing functional group, or a copolymer of vinyl monomers having a nitrogen-containing functional group and vinyl monomers having no nitrogen-containing functional group (other vinyl monomers), and having a hydrophobic group at a site other than repeating units constituting the polymer.

Examples of the vinyl monomer having a nitrogen-containing functional group include acrylamide and its derivatives, and heterocyclic monomer having a nitrogen-containing functional group, and the like, among which those having an amide bond are preferable. Specific examples thereof include acrylamide, N,N-dimethyl acrylamide, N-isopropyl acrylamide, N,N-diethyl acrylamide, N,N-dimethylaminopropyl acrylamide, t-butyl acrylamide, diacetone acrylamide, N,N'-methylenebisacrylamide, N-vinyl-N-methyl acrylamide, N-vinyl pyrrolidone, N-vinyl caprolactam and the like. Among these, from the perspective of solubility, acrylamide, N-vinylpyrrolidone, N-vinylcaprolactam and the like are particularly preferable.

The other vinyl monomers are not particularly limited as long as copolymerization with a vinyl monomer having a nitrogen-containing functional group is possible, and examples thereof include styrene, acrylic acid, vinyl acetate, and long-chain α-olefins.

The method for introducing the terminal hydrophobic group into the water-soluble polymer is not particularly limited, but it is generally convenient and preferable to introduce the hydrophobic group by selecting a suitable chain transfer agent for vinyl polymerization. In this instance, the chain transfer agent is not particularly limited as long as a group containing a hydrophobic group such as an alkyl group, an aralkyl group, an aryl group, an alkylthio group, an aralkylthio group or an arylthio group is introduced to the terminal of the obtained polymer. For example, for obtaining a water-soluble polymer having an alkylthio group, an aralkylthio group or an arylthio group as the terminal hydrophobic group, it is preferable to implement vinyl polymerization using a chain transfer agent having a hydrophobic group corresponding to the terminal hydrophobic group, specifically, a thiol, a disulfide, a thioether or the like.

The main chain portion of the water-soluble polymer is water-soluble and has a nitrogen-containing functional group. The number of constituent units (degree of polymerization) of the main chain portion in one molecule is preferably 2 to 1000, more preferably 3 to 1000, and particularly preferably 5 to 10. If the number of constituent units of the main chain portion having a nitrogen-containing functional group is too large, the surface activity tends to decrease.

With respect to the water-soluble polymer, the molecular weight ratio of the main chain portion to the terminal hydrophobic group portion (for example, an alkyl group, an aralkyl group, an aryl group, an alkylthio group, an aralkylthio group, an arylthio group, etc.) (i.e., mass average molecular weight of the main chain portion/mass average molecular weight of the terminal hydrophobic group portion) is preferably 0.3 to 170.

As the surfactant (C), a nonionic surfactant is preferable among those mentioned above because of its less influence on the resist layer.

The amount of the surfactant (C) is preferably 5 to 80 parts by mass, more preferably 10 to 70 parts by mass, and even more preferably 10 to 60 parts by mass, with respect to 100 parts by mass in total of the conductive polymer (A), the basic compound (B) and the surfactant (C). When the amount of the surfactant (C) is within the above range, the coatability of the conductive composition on the resist layer further improves.

(Solvent (D))

The solvent (D) is not particularly limited as long as it is a solvent capable of dissolving the conductive polymer (A), the basic compound (B) and the surfactant (C), and the effect of the present invention can be achieved, and examples thereof include water, an organic solvent, a mixed solvent of water and an organic solvent.

Examples of water include tap water, ion-exchanged water, pure water, distilled water and the like.

Examples of the organic solvent include alcohols such as methanol, ethanol, isopropyl alcohol, propyl alcohol and butanol; ketones such as acetone and ethyl isobutyl ketone; ethylene glycols such as ethylene glycol and ethylene glycol methyl ether; propylene glycols such as propylene glycol, propylene glycol methyl ether, propylene glycol ethyl ether, propylene glycol butyl ether and propylene glycol propyl ether; amides such as dimethylformamide and dimethylacetamide; and pyrrolidones such as N-methylpyrrolidone and N-ethylpyrrolidone. One of these organic solvents may be used alone, or two or more of them may be used in the form of a mixture thereof with an appropriate blending ratio.

When a mixed solvent of water and an organic solvent is used as the solvent (D), the mass ratio of water to an organic solvent (water/organic solvent) is preferably 1/100 to 100/1, and more preferably 2/100 to 100/2.

The amount of the solvent (D) is preferably 1 to 99% by mass, more preferably 10 to 98% by mass, and even more preferably 50 to 98% by mass, based on a total mass of the conductive composition. When the amount of the solvent (D) is within the range described above, the coatability further improves.

When the conductive polymer (A) is used in a state of being dispersed or dissolved in an aqueous medium by purification or the like (hereinafter, the conductive polymer (A) in this state is also referred to as a "conductive polymer solution"), the aqueous medium for the conductive polymer solution is also counted into the amount of the solvent (D) in the conductive composition.

(Optional Component)

The conductive composition may contain components (optional components) other than the conductive polymer (A), the basic compound (B), the surfactant (C) and the water (D), if necessary.

Examples of the optional component include a pigment, an antifoaming agent, an ultraviolet light absorber, an antioxidant, a heat resistance improver, a leveling agent, an antidripping agent, a matting agent, and a preservative.

(Properties)

The conductive composition of the first embodiment of the present invention satisfies the following condition 1.

Condition 1: An area ratio (X/Y) is 0.046 or less as calculated by an evaluation method including steps (I) to (VI) defined below:
  a step (I) of preparing a test solution by dissolving the conductive composition in an eluent having a pH adjusted to 10 or more so as to adjust a solids content of the conductive polymer (A) to 0.1% by mass,
  a step (II) of measuring a molecular weight distribution of the test solution using a polymer material evaluation device equipped with a gel permeation chromatograph to obtain a chromatogram,
  a step (III) of converting retention times into sodium polystyrene sulfonate-equivalent molecular weight values (M) with respect to the chromatogram obtained in the step (II),
  a step (IV) of determining an area (X) of a region corresponding to sodium polystyrene sulfonate-equivalent molecular weight values (M) ranging from 300 to 3300,
  a step (V) of determining an area (Y) of an entire region ascribed to the conductive polymer (A) in terms of the sodium polystyrene sulfonate-equivalent molecular weight values (M), and
  a step of (VI) of obtaining an area ratio (X/Y) of the area (X) to the area (Y).

The step (I) is a step of dissolving the conductive composition in an eluent so as to adjust the solids content of the conductive polymer (A) to 0.1% by mass, thereby preparing a test solution.

The eluent is a solution in which a solute is dissolved in a solvent. Examples of the solvent include water, acetonitrile, alcohols (methanol, ethanol, etc.), dimethylformamide, dimethyl sulfoxide, and a mixed solvent thereof.

Examples of the solute include sodium carbonate, sodium hydrogen carbonate, sodium dihydrogen phosphate, trisodium phosphate, disodium hydrogen phosphate, glycine, sodium hydroxide, potassium chloride, boric acid and the like.

The pH of the eluent used in the step (I) is 10 or more. When the pH is less than 10, the determined value may fluctuate. By using an eluent having a pH of 10 or more, stable measurement results are available.

An eluent having a pH of 10 or more can be prepared, for example, as follows.

First, water (ultrapure water) and methanol are mixed so as to adjust the volume ratio of water:methanol to 8:2 to obtain a mixed solvent. Then, sodium carbonate and sodium hydrogen carbonate are added to the obtained mixed solvent so as to adjust the respective solids contents to 20 mmol/L and 30 mmol/L, to thereby obtain an eluent.

The eluent thus obtained has a pH of 10.8 at 25° C.

The pH of the eluent is a value measured using a pH meter while maintaining the temperature of the eluent at 25° C.

The method for preparing an eluent having a pH of 10 or more is not limited to the above method, and for example, a mixed solvent of water and methanol (water:methanol=8:2) is used to separately prepare sodium carbonate having a solids content of 20 mmol/L and sodium hydrogen carbonate having a solids content of 30 mmol/L, followed by mixing these to form an eluent.

With respect to the conductive composition added to the eluent, a solid form of the conductive composition may be added to and dissolved in the eluent, or a liquid form of the conductive composition containing the solvent (D) may be added to the eluent, as long as the solids content of the conductive polymer (A) when added to the eluent is 0.1% by mass. When the solids content of the conductive polymer (A) in the test solution is 0.1% by mass, a satisfactory pH buffering action of the eluent is shown and stable measurement results can be obtained.

When the conductive composition containing the solvent (D) is used, the solids content of the conductive composition is not particularly limited as long as the solids content of the conductive polymer (A) after addition of the conductive composition to the eluent becomes 0.1% by mass, but is preferably 1.0% by mass or more. When the solids content of the conductive composition is less than 1.0% by mass, the pH buffering action of the eluent does not work sufficiently when added to the eluent, and the pH of the test solution falls below 10, which causes fluctuation of the determined values and hence makes it difficult to obtain stable measurement results.

The step (II) is a step of measuring the molecular weight distribution of the test solution by gel permeation chromatography (GPC) using a polymer material evaluation device.

The polymer material evaluation device is equipped with a gel permeation chromatograph, and can separate and analyze chemical compounds (polymers, oligomers, monomers) according to their molecular weights.

A detector such as a photodiode array detector or a UV detector is connected to the gel permeation chromatograph.

In the step (II), the GPC produces, for example, a chromatogram as shown in FIG. 1.

In the chromatogram shown in FIG. 1, the ordinate represents the absorbance and the abscissa represents the retention time, and higher molecular weight components are detected at relatively short retention times, while lower molecular weight components are detected at relatively long retention times.

The step (III) is a step of converting retention times into sodium polystyrene sulfonate-equivalent molecular weight values (M) with respect to the chromatogram obtained in the step (II).

Specifically, sodium polystyrene sulfonate samples having peak top molecular weights of 206, 1030, 4210, 13500, 33500, 78400, 158000, 2350000 are used as reference samples, which are respectively dissolved in an eluent in the same manner as in the preparation of the test solution so as to adjust the respective solids contents to 0.05% by mass except that the solids content of the reference sample having a peak top molecular weight of 206 is adjusted to 0.0025% by mass, thereby preparing reference solutions. With respect to the reference solutions, the relationships between the retention times and the molecular weights are obtained by GPC, to prepare a calibration curve. From the prepared calibration curve, the retention times of the chromatogram obtained in the step (II) are converted to the sodium polystyrene sulfonate-equivalent molecular weight values (M).

The step (IV) is a step of determining an area (X) of a region corresponding to sodium polystyrene sulfonate-equivalent molecular weight values (M) ranging from 300 to 3300, for example, as shown in FIG. 1.

The step (V) is a step of determining an area (Y) of an entire region ascribed to the conductive polymer (A).

The step of (VI) is a step of obtaining an area ratio (X/Y) of the area (X) to the area (Y).

The conductive composition of the first embodiment of the present invention has an area ratio (X/Y) of 0.046 or less, which is a ratio calculated by the above-mentioned evaluation method, that is, a ratio of an area (X) of a region corresponding to molecular weight values (M) ranging from 300 to 3300, relative to an area (Y) of an entire region ascribed to the conductive polymer (A). When the area ratio (X/Y) is 0.046 or less, it is possible to suppress the generation of contaminants in the coating film formed from the conductive composition. The reason for this is considered as follows.

As described above, the basic compound (B) contained in the conductive composition neutralizes the conductive polymer (A), thereby suppressing the generation of acidic groups eliminated from the conductive polymer (A) and decomposition products of oxidizing agents (for example, sulfate ions, etc.) in the conductive composition. In addition, the amount of the decomposition products of the conductive polymer (A) in the conductive composition can be reduced as well.

However, as will be described in detail later, when the conductive polymer (A) is neutralized with the basic compound (B), heating is implemented for the purpose of promoting the neutralization. As a result, low molecular weight components are generated. The low molecular weight components, being hydrophobic substances, hinder the uniformity of the film and become a factor of lowering the conductivity. In addition, it is considered that the low molecular weight components aggregate during the film formation and emerge as contaminants on the coating film. That is, the low molecular weight components are defect factor components.

The area (X) is an area of a region corresponding to molecular weight values (M) ranging from 300 to 3300, in which low molecular weight components that result in contaminants are primarily present. When the area ratio (X/Y) is 0.046 or less, the proportion of low molecular weight components contained in the conductive composition is low, so that contaminants are less likely to be generated in the coating film formed from the conductive composition.

The smaller the area ratio (X/Y) value, the smaller the proportion of low molecular weight components contained in the conductive composition. Therefore, the area ratio (X/Y) value is preferably as small as possible. Specifically, this value is preferably 0.040 or less. The lower limit of the area ratio (X/Y) is a value which falls on or below the detection limit, and for example, the area ratio (X/Y) is preferably 0.001 or more. That is, the area ratio (X/Y) is 0.046 or less, preferably 0.001 to 0.046, and more preferably 0.001 to 0.040.

In order to obtain the conductive composition having an area ratio (X/Y) of 0.046 or less, for example, a purification step may be introduced in the production of the conductive composition.

An example of method for producing the conductive composition is described below.

(Production Method)

In the present embodiment, the method for producing the conductive composition includes a step (heating step) of heat-treating a mixed solution containing the conductive polymer (A) and the basic compound (B), and a step (purification step) of purifying the heat-treated mixed solution so as to have an area ratio (X/Y) of 0.046 or less as calculated by an evaluation method including the steps (i) to (vi) defined below:

a step (i) of preparing a test solution by dissolving the purified mixed solution in an eluent having a pH adjusted to 10 or more so as to adjust a solids content of the conductive polymer (A) to 0.1% by mass, a step (ii) of measuring a molecular weight distribution of the test solution using a polymer material evaluation device equipped with a gel permeation chromatograph to obtain a chromatogram, a step (iii) of converting retention times into sodium polystyrene sulfonate-equivalent molecular weight values (M) with respect to the chromatogram obtained in the step (ii), a step (iv) of determining an area (X) of a region corresponding to sodium polystyrene sulfonate-equivalent molecular weight values (M) ranging from 300 to 3300, a step (v) of determining an area (Y) of an entire region ascribed to the conductive polymer (A) in terms of the sodium polystyrene sulfonate-equivalent molecular weight values (M), and a step of (vi) of obtaining an area ratio (X/Y) of the area (X) to the area (Y).

The heating step is a step of heat-treating a mixed solution containing the conductive polymer (A) and the basic compound (B).

The conductive polymer (A) to be used is preferably a product purified during the production of the conductive polymer (A). The purified conductive polymer (A) is obtained in the form of a conductive polymer solution as described above. Therefore, the mixed solution can be obtained by adding the basic compound (B) to the conductive polymer solution. If necessary, the solvent (D) may be added to the obtained mixed solution for dilution.

When the solid conductive polymer (A) is used, it is preferable to mix the solid conductive polymer (A) with the solvent (D) in advance to prepare a conductive polymer solution, followed by addition of the basic compound (B) to the obtained conductive polymer solution.

The method for mixing the components is not particularly limited as long as the conductive polymer (A) and the basic compound (B) may be uniformly mixed in the solvent (D). Examples of the mixing method include a method of stirring using a stirring rod, a stirrer, a shaker, or the like depending on the volume of the components to be dissolved.

Further, in the context of the present specification, a mixed solution containing the conductive polymer (A) and the basic compound (B) is also referred to as a "conductive polymer-containing solution".

When the conductive polymer (A) and the basic compound (B) come into contact with each other, a neutralization reaction proceeds. This neutralization reaction proceeds even at room temperature, but the reaction is slow. Therefore, in the heating step, a mixed solution containing the conductive polymer (A) and the basic compound (B) is heat-treated to allow the neutralization reaction to proceed. In this context, "room temperature" means 25° C.

Further, in this specification, the heating step is also referred to as a "neutralization step".

The heating temperature in the heating step is preferably 40° C. or higher from the viewpoint of stirring efficiency, and more preferably 60 to 80° C. from the viewpoint of the concentration of acidic substances and the conductivity stability over time.

The heating method in the heating step is not particularly limited, and may be implemented by holding the temperature of the mixed solution containing the conductive polymer (A) and the basic compound (B) at a predetermined temperature for a predetermined period of time. For example, after adding the basic compound (B) to the conductive polymer solution, the resulting may be heated at a predetermined temperature. Alternatively, the basic compound (B) may be added to the conductive polymer solution heated in advance to a predetermined temperature.

By the heating step, the conductive polymer (A) is neutralized with the basic compound (B). That is, a stable salt is formed between the acidic group of the conductive polymer (A) and the basic compound (B).

The purification step is a step of purifying the heat-treated mixed solution so as to have an area ratio (X/Y) of 0.046 or less as calculated by an evaluation method comprising the steps (i) to (vi) described above.

In the context of the present specification, the mixed solution after heating and before purification is also referred to as "unpurified mixed solution".

The step (i) is a step of dissolving the purified mixed solution, i.e., the purified conductive polymer-containing solution, in an eluent so as to adjust the solids content of the conductive polymer (A) to 0.1% by mass, thereby preparing a test solution.

The eluent is the same as that used in the step (I) described above.

The solids content of the purified mixed solution is not particularly limited, but is preferably 1.0% by mass or more. When the solids content of the purified mixed solution is less than 1.0% by mass, the pH buffering action of the eluent does not work sufficiently when the purified mixed solution is added to the eluent, and the pH of the test solution becomes less than 10, which causes fluctuation of the determined values and hence makes it difficult to obtain stable measurement results.

The steps (ii) to (vi) are the same as the steps (II) to (VI) described above.

Examples of the method for purifying the unpurified mixed solution so as to give an area ratio (X/Y) of 0.046 or less include a membrane filtration method, an anion exchange method, and a contact method with an adsorbent.

As the filtration membrane used in the membrane filtration method, a permeable membrane is preferable, and a microfiltration membrane and an ultrafiltration membrane are particularly preferable for removing low molecular weight components.

Examples of the material of the microfiltration membrane include organic films such as polyethylene (PE), ethylene tetrafluoride (PTFE), polypropylene (PP), cellulose acetate (CA), polyacrylonitrile (PAN), polyimide (PI), polysulfone (PS), polyethersulfone (PES) and nylon (Ny). Nylon and polyethylene are particularly preferable because of their excellent solvent resistance.

The filter structure of the microfiltration membrane is not particularly limited as long as it is formed of a material used in conventional microfiltration membranes, and examples thereof include a flat membrane pleated type and a hollow fiber type.

The material of the ultrafiltration membrane is not particularly limited as long as it is a material used in conventional ultrafiltration membranes. For example, the ultrafiltration membrane may be an organic membrane formed of cellulose, cellulose acetate, polysulfone, polypropylene, polyester, polyethersulfone, polyvinylidene fluoride, or the like; an inorganic membrane formed of ceramics or the like; or an organic-inorganic hybrid membrane. In particular, a ceramic film is preferable because it shows excellent solvent resistance and easy maintenance such as chemical cleaning is possible.

As the value of the fractionated molecular weight of the ultrafiltration membrane increases, the critical permeation flux increases and the conductivity of the conductive composition obtained after purification tends to increase, while the yield tends to decrease.

Similarly, as the value of the pore size of the ultrafiltration membrane increases, the critical permeation flux increases, and the conductivity of the conductive composition obtained after purification tends to increase, while the yield tends to decrease.

When the unpurified mixed solution is purified by the membrane filtration method, the filtration pressure is preferably about 0.01 to 1.0 MPa in consideration of productivity, although it depends on the ultrafiltration membrane and the filtration device.

The filtration time is not particularly limited. However, supposing that other conditions are the same, a longer filtration time tends to lead to a higher degree of purification and a higher conductivity of the conductive composition obtained after purification.

When the unpurified mixed solution is purified by the anion exchange method, for example, the unpurified mixed solution may be brought into contact with an anion exchange resin.

The solids content of the unpurified mixed solution is preferably 0.1 to 20% by mass, and more preferably 0.1 to 10% by mass. When the solids content of the unpurified mixed solution is 0.1% by mass or more, the purified mixed solution can be easily recovered. On the other hand, when the solids content of the unpurified mixed solution is 20% by mass or less, excessive viscosity increase can be prevented and efficient contact with the anion exchange resin is possible, so that satisfactory ion exchange effect is achieved.

The anion exchange resin has innumerable ion exchange groups (fixed ions) fixed to the resin base on its surface or inside. These ion exchange groups allow selective ion-exchange (adsorb) with and removal of the low molecular weight components generated as a result of neutralization of the conductive polymer (A). In addition, the ion exchange groups also allow selective ion-exchange of anions as impurities to capture them, and hence can remove anions from the unpurified mixed solution.

Examples of the anion exchange resin include a strongly basic anion exchange resin and a weakly basic anion exchange resin. Among these, a strongly basic anion exchange resin is preferable because it has a high ion exchange ability and can sufficiently remove low molecular weight components.

In this context, a "strong base" is a base having a large base dissociation constant. Specifically, the strong base is one showing an ionization degree close to 1 in an aqueous solution, which quantitatively generates hydroxide ions, and has a base dissociation constant (PKb) of pKb<0 (Kb>1). On the other hand, a "weak base" is a one having a small base dissociation constant. Specifically, the weak base is one showing an ionization degree of less than 1 and close to 0 in an aqueous solution, and has less ability to deprive other substances of hydrogen ions.

Examples of the strongly basic anion exchange resin include anion exchange resins having a quaternary ammonium salt, a tertiary sulfonium base, a quaternary pyridinium base or the like as an ion exchange group. Examples of commercially available products include "Orlite DS-2"

manufactured by Organo Corporation; and "Diaion SA10A" manufactured by Mitsubishi Chemical Corporation.

On the other hand, examples of the weakly basic anion exchange resin include an anion exchange resin having a primary to tertiary amino group as an ion exchange group. Examples of commercially available products include "Diaion WA20" manufactured by Mitsubishi Chemical Corporation; and "Amberlite IRA67" manufactured by Organo Corporation.

When the unpurified mixed solution is purified by contact with an adsorbent, the contact method is not particularly limited, and a method suitable for the application may be selected from a batch method, a column method and the like.

The adsorbent is not particularly limited as long as it has an appropriate pore size to allow a target substance to diffuse in the pores of the adsorbent and reach the adsorption surfaces, but synthetic adsorbents are preferable, and aromatic synthetic adsorbents are particularly preferable. Examples of commercially available aromatic synthetic adsorbents include "Sepabeads SP850", "Sepabeads SP825L" and "Sepabeads SP700", each manufactured by Mitsubishi Chemical Corporation.

The weight average molecular weight of the conductive polymer (A) in the purified mixed solution is preferably 3000 to 1,000,000, more preferably 5,000 to 800,000, even more preferably 10,000 to 500,000, and particularly preferably 11,000 to 100,000. When the weight average molecular weight is 3000 or more, the resulting product excels in conductivity, film formability and film strength. Especially, when the weight average molecular weight is 10,000 or more, the generation of contaminants during the formation of the coating film can be further suppressed. On the other hand, when the weight average molecular weight is 1,000,000 or less, the resulting product shows excellent solubility in solvents. The weight average molecular weight of the conductive polymer in the purified mixed solution is a value measured by implementing the above-mentioned steps (i) to (iii).

As described above, the conductive composition satisfying the area ratio (X/Y) of 0.046 or less can be obtained by heating and then purifying the mixed solution containing the conductive polymer (A) and the basic compound (B).

In the case of the conductive composition containing the surfactant (C) or the optional component, the surfactant (C) or the optional component may be added to the mixed solution in the heating step or the purification step, but it is preferable to add the surfactant (C) or the optional component to the mixed solution after the purification. Further, if necessary, the purified mixed solution may be further diluted with the solvent (D). That is, in the present embodiment, the method for producing the conductive composition may include a step of adding the surfactant (C), the solvent (D), and if necessary, the optional component to the purified mixed solution.

Technical Effect

Since the conductive composition of the first embodiment of the present invention satisfies the condition 1 described above, the defect factor components are sufficiently reduced. Therefore, with the use of the conductive composition of the first embodiment of the present invention, contaminants are less likely to be generated when the conductive composition is formed into a coating film. Further, the conductive composition of the first embodiment of the present invention contains less amount of defect factor components and, hence, is a new composition distinct from the conventional compositions.

Moreover, since the conductive composition of the first embodiment of the present invention contains the basic compound (B) in addition to the conductive polymer (A), the conductive polymer (A) is neutralized. Therefore, the use of the conductive composition of the first aspect of the present invention enables the formation of a coating film from which acidic substances are less likely to migrate into a resist layer, thereby suppressing adverse effects such as resist loss of the resist layer.

Further, according to the above-mentioned method for producing a conductive composition, a conductive composition satisfying the condition 1 described above can be easily produced.

(Application)

The conductive composition of the first embodiment of the present invention is suitable for making a resist layer antistatic. Specifically, the conductive composition of the first embodiment of the present invention is applied to the surface of a resist layer for a charged particle beam patterning method using a chemically amplified resist to form a coating film. The coating film thus formed serves as an antistatic film for the resist layer.

Furthermore, the conductive composition of the first embodiment of the present invention can also be used as a material for, for example, a capacitor, a transparent electrode, or a semiconductor.

When the coating film obtained from the conductive composition of the first embodiment of the present invention is used as an antistatic film of a resist layer, the conductive composition of the first embodiment of the present invention is applied to the surface of a resist layer by any of various coating methods, and then, a pattern is formed by charged particle beams. According to the present invention, it is possible to suppress the migration of acidic substances from the coating film (antistatic film) formed of the conductive composition to a resist layer and hence to obtain an originally intended pattern shape of the resist layer.

Second Embodiment

The conductive composition of the second embodiment of the present invention contains a conductive polymer (A) and a basic compound (B). The conductive composition preferably further contains a surfactant (C) or a solvent (D).

Examples of the conductive polymer (A), the basic compound (B), the surfactant (C) and the solvent (D) include those listed above in the description of the first embodiment.

The conductive composition of the second embodiment of the present invention satisfies the following condition 2.

Condition 2: ZS/ZR is 20 or less,
wherein the ZS is a maximum value of fluorescence intensity in a wavelength region of 320 to 420 nm when a fluorescence spectrum is measured using a spectrofluorometer at an excitation wavelength of 230 nm with respect to a measurement solution obtained by diluting the conductive composition with water so as to adjust solids content of the conductive polymer (A) to 0.6% by mass, and
the ZR is a maximum value of Raman scattering intensity in a wavelength region of 380 to 420 nm when a fluorescence spectrum of water is measured using a spectrofluorometer at an excitation wavelength of 350 nm.

Specifically, the maximum value (ZS) of the fluorescence intensity in the wavelength region of 320 to 420 nm is measured using a spectrofluorometer as follows.

A measurement solution obtained by diluting the conductive composition with water so as to adjust the solids content of the conductive polymer (A) to 0.6% by mass is placed in a surface fluorescence measurement cell (triangular cell), and the fluorescence spectrum is obtained using a spectrofluorometer under the following measurement condition 1. The obtained fluorescence spectrum is separately corrected by a device function obtained using Rhodamine B for a spectrofluorometer. For the corrected fluorescence spectrum, the maximum value (ZS) of the fluorescence intensity of the measurement solution is obtained from the maximum peak height in the wavelength region of 320 to 420 nm.

(Measurement Condition 1)
  Excitation wavelength: 230 nm
  Fluorescence measurement wavelength: 250-450 nm
  Bandwidth: 10 nm on the excitation side, 5 nm on the fluorescence side
  Response: 2 sec
  Scanning speed: 100 nm/min Specifically, the maximum value (ZR) of the Raman scattering intensity in the wavelength region of 380 to 420 nm is measured using a spectrofluorometer as follows.

Water is placed in a surface fluorescence measurement cell (triangular cell), and the fluorescence spectrum is obtained using a spectrofluorometer under the following measurement condition 2. The obtained fluorescence spectrum is separately corrected by a device function obtained using Rhodamine B for a spectrofluorometer. For the corrected fluorescence spectrum, the maximum value (ZR) of the Raman scattering intensity of the water is obtained from the maximum peak height in the wavelength region of 380 to 420 nm.

(Measurement Condition 2)
  Excitation wavelength: 350 nm
  Fluorescence measurement wavelength: 350-450 nm
  Bandwidth: 10 nm on the excitation side, 5 nm on the fluorescence side
  Response: 2 sec
  Scanning speed: 100 nm/min When the fluorescence spectrum is measured at an excitation wavelength of 230 nm, the peaks appearing in the wavelength region of 320 to 420 nm are primarily peaks ascribed to the defect factor components (low molecular weight components). When the ZS/ZR is 20 or less, the proportion of the defect factor components (low molecular weight components) contained in the conductive composition is low, so that contaminants are less likely to be generated in the coating film formed from the conductive composition. In addition, the ZS/ZR of 20 or less means that the proportion of the fluorescent substances in the conductive composition is also low.

In this context, the smaller the ZS/ZR, the smaller the proportion of low molecular weight components contained in the conductive composition. Therefore, the ZS/ZR is preferably as small as possible. Specifically, the ZS/ZR is preferably 10 or less, and more preferably 5 or less. Further, the ZS/ZR is preferably 0 or more. That is, the ZS/ZR is 0 to 20, preferably 0 to 10, and more preferably 0 to 5.

In order to obtain the conductive composition having a ZS/ZR of 20 or less, for example, a purification step may be introduced in the production of the conductive composition.

An example of method for producing the conductive composition is described below.

(Production Method)

In the present embodiment, the method for producing the conductive composition includes a step (heating step) of heat-treating a mixed solution containing the conductive polymer (A) and the basic compound (B), and a step (purification step) of purifying the heat-treated mixed solution so as to have a ratio, ZS/ZR, of 20 or less.

The specific methods for implementing the heating step and the purification step in the present embodiment are the same as the heating step and the purification step in the method for producing the conductive composition in the first embodiment.

By heating and then purifying the mixed solution containing the conductive polymer (A) and the basic compound (B), a conductive composition having a ZS/ZR of 20 or less can be obtained.

In the case of the conductive composition containing the surfactant (C) or the optional component, the surfactant (C) or the optional component may be added to the mixed solution in the heating step or the purification step, but it is preferable to add the surfactant (C) or the optional component to the mixed solution after the purification. Further, if necessary, the purified mixed solution may be further diluted with the solvent (D). That is, in the present embodiment, the method for producing the conductive composition may include a step of adding the surfactant (C), the solvent (D), and if necessary, the optional component to the purified mixed solution.

Technical Effect

Since the conductive composition of the second embodiment of the present invention satisfies the condition 2 described above, the defect factor components are sufficiently reduced. Therefore, with the use of the conductive composition of the second embodiment of the present invention, contaminants are less likely to be generated when the conductive composition is formed into a coating film. Further, the conductive composition of the second embodiment of the present invention contains less amounts of luminescent substances as well as defect factor components and, hence, is a new composition distinct from the conventional compositions.

Moreover, since the conductive composition of the second embodiment of the present invention contains the basic compound (B) in addition to the conductive polymer (A), the conductive polymer (A) is neutralized. Therefore, the use of the conductive composition of the second embodiment of the present invention enables the formation of a coating film from which acidic substances are less likely to migrate into a resist layer, thereby suppressing adverse effects such as resist loss of the resist layer.

Further, according to the above-mentioned method for producing a conductive composition, a conductive composition satisfying the condition 2 described above can be easily produced.

(Application)

The application of the conductive composition of the second embodiment of the present invention is the same as the application of the conductive composition of the first embodiment.

[Conductor]

The conductor of the third embodiment of the present invention includes a substrate and a coating film formed by applying the conductive composition of the first or second embodiment of the present invention on at least one surface of the substrate.

An example of the method for producing the conductor of the present invention is described below.

In the present embodiment, the method for producing a conductor includes a step (coating step) of applying the conductive composition of the first or second embodiment of the present invention on at least one surface of a substrate to form a coating film.

Examples of the substrate include plastics, wood materials, paper materials, ceramics, films thereof, glass plates and the like. Among these, plastics and films thereof are particularly preferably used from the viewpoint of adhesion.

Examples of the polymer compound used for plastics and films thereof include polyethylene, polyvinyl chloride, polypropylene, polystyrene, ABS resin, AS resin, methacrylic resin, polybutadiene, polycarbonate, polyarylate, polyvinylidene fluoride, polyester, polyamide, polyimide, polyaramid, polyphenylene sulfide, polyetheretherketone, polyphenylene ether, polyethernitrile, polyamideimide, polyethersulfone, polysulfone, polyetherimide, polyethylene terephthalate, polybutylene terephthalate, and polyurethane.

In order to improve the adhesion to a conductive polymer film, the plastic substrate or a film thereof may be subjected to corona surface treatment or plasma treatment in advance on its surface on which the conductive polymer film is formed.

As a method for applying the conductive composition on a substrate, a method used for conventional coating can be adopted. Examples of the method include coating methods using a gravure coater, a roll coater, a curtain flow coater, a spin coater, a bar coater, a reverse coater, a kiss coater, a fountain coater, a rod coater, an air doctor coater, a knife coater, a blade coater, a cast coater, a screen coater, etc.; spraying methods such as spray coating; and dipping methods such as dip coating.

The conductive composition is preferably coated on the substrate so that a coating film having a thickness of 5 to 150 nm is formed after drying.

After the conductive composition is applied onto the substrate to form a coating film, the coating film may be left as it is at room temperature (25° C.), or the coating film may be heat-treated.

When the heat treatment is performed, the heat treatment temperature is preferably 40 to 250° C., and more preferably 50 to 200° C.

The heat treatment time is preferably 0.5 minutes to 1 hour, and more preferably 1 to 50 minutes.

Technical Effects

Since the conductor of the third embodiment of the present invention described above has a coating film formed from the conductive composition of the first or second embodiment of the present invention, the conductor shows high conductivity and the generation of contaminants is also suppressed.

Further, the above-described method for producing a conductor uses the conductive composition of the first or second embodiment of the present invention, thereby enabling production of a conductor which shows high conductivity and generates less contaminants even when the coating film is left at room temperature or heat-treated.

Other embodiments of the present invention are as enumerated below.
    <1> A conductive composition including a conductive polymer (A) having an acidic group, and a basic compound (B),
    wherein an area ratio (X/Y) is 0.046 or less, preferably 0.001 to 0.046, and more preferably 0.001 to 0.040 as calculated by an evaluation method including the aforementioned steps (I) to (VI).
    <2> A conductive composition including a conductive polymer (A) having an acidic group, and a basic compound (B), wherein
the ZS/ZR is 20 or less, preferably 0 to 10, and more preferably 0 to 5.
    <3> The conductive composition according to <1> or <2>, wherein the conductive polymer (A) has a monomer unit represented by the formula (5).
    <4> The conductive composition according to any one of <1> to <3>, wherein the amount of the conductive polymer (A) is 0.1 to 5% by mass or less, more preferably 0.2 to 3% by mass, and even more preferably 0.5 to 2% by mass, based on a total mass of the conductive composition.
    <5> The conductive composition according to any one of <1> to <4>, wherein the amount of the conductive polymer (A) is 50 to 99.9% by mass, more preferably 80 to 99.9% by mass, and even more preferably 95 to 99.9% by mass, based on a total mass of solid components of the conductive composition.
    <6> The conductive composition according to any one of <1> to <5>, wherein the basic compound (B) is at least one selected from the group consisting of the quaternary ammonium compound (b-1), the basic compound (b-2), and the basic compound (b-3), and preferably at least one selected from the group consisting of the quaternary ammonium compound (b-1) and the basic compound (b-2).
    <7> The conductive composition according to <6>, wherein the basic compound (B) is the basic compound (b-2), and preferably tetrabutylammonium hydroxide.
    <8> The conductive composition according to any one of <1> to <7>, wherein the amount of the basic compound (B) is 0.1 to 1 mol equivalent, more preferably 0.1 to 0.9 mol equivalent, and even more preferably 0.25 to 0.85 mol equivalent, with respect to 1 mol of the unit having an acidic group among the units constituting the conductive polymer (A).
    <9> The conductive composition according to any one of <1> to <8>, further including a surfactant (C) and a solvent (D).
    <10> The conductive composition of <9>, wherein the surfactant (C) is a water-soluble polymer having the nitrogen-containing functional group and the terminal hydrophobic group.
    <11> The conductive composition according to <9> or <10>, wherein the amount of the surfactant (C) is 5 to 80 parts by mass, more preferably 10 to 70 parts by mass, and even more preferably 10 to 60 parts by mass, with respect to 100 parts by mass in total of the conductive polymer (A), the basic compound (B) and the surfactant (C).
    <12> The conductive composition according to any one of <9> to <11>, wherein the solvent (D) includes water and alcohols.
    <13> The conductive composition according to any one of <9> to <12>, wherein the amount of the solvent (D) is 1 to 99% by mass, more preferably 10 to 98% by mass, and even more preferably 50 to 98% by mass, based on a total mass of the conductive composition.

<14> A conductor including a substrate, and a coating formed on at least one surface of the substrate by coating the surface with the conductive composition of any one of <1> to <13>.

<15> A method for producing a conductor, which includes applying the conductive composition of any one of <1> to <13> to at least one surface of a substrate to form a coating film.

<16> A method for producing a conductive composition, including:
a step (heating step) of heat-treating a mixed solution containing a conductive polymer (A) having an acidic group and a basic compound (B), and
a step of purifying the heat-treated mixed solution so as to have an area ratio (X/Y) of 0.046 or less, preferably 0.001 to 0.046, and more preferably 0.001 to 0.040 as calculated by an evaluation method including the aforementioned steps (i) to (vi).

<17> A method for producing a conductive composition, including:
a step (heating step) of heat-treating a mixed solution containing a conductive polymer (A) having an acidic group and a basic compound (B), and
a step (purification step) of purifying the heat-treated mixed solution so as to have the ratio, ZS/ZR, of 20 or less, preferably 0 to 10, and more preferably 0 to 5.

<18> The method according to <16> or <17>, wherein the heating temperature in the heating step is 40° C. or higher, and more preferably 60 to 80° C.

<19> The method according to any one of <16> to <18>, wherein the method for purifying the mixed solution in the purification step is at least one selected from the group consisting of a membrane filtration method, an anion exchange method, and a contact method with an adsorbent.

<20> The method according to <19>, wherein the filtration membrane used in the membrane filtration method is a microfiltration membrane or an ultrafiltration membrane, more preferably a nylon filter.

<21> The method according to <19> or <20>, wherein the anion exchange resin used in the anion exchange method is a strongly basic anion exchange resin or a weakly basic anion exchange resin, more preferably a strongly basic anion exchange resin.

<22> The method according to any one of <19> to <21>, wherein the adsorbent used in the contact method is a synthetic adsorbent, more preferably an aromatic synthetic adsorbent.

<23> The method according to any one of <16> to <22>, wherein the conductive polymer (A) has a monomer unit represented by the formula (5).

<24> The method according to any one of <16> to <23>, wherein the basic compound (B) is at least one selected from the group consisting of the quaternary ammonium compound (b-1), the basic compound (b-2), and the basic compound (b-3), and preferably at least one selected from the group consisting of the quaternary ammonium compound (b-1) and the basic compound (b-2).

<25> The method according to <24>, wherein the basic compound (B) is the basic compound (b-2), and preferably tetrabutylammonium hydroxide.

<26> The method according to <16> to <25>, further including a step of adding a surfactant (C) and a solvent (D) to the purified mixed solution.

<27> The method according to <26>, wherein the surfactant (C) is a water-soluble polymer having the nitrogen-containing functional group and the terminal hydrophobic group.

<28> The method according to <26> or <27>, wherein the solvent (D) comprises water and alcohols.

EXAMPLES

Hereinbelow, the present invention will be specifically described in more detail by way of Examples which should not be construed as limiting the present invention.

The various measurements and evaluations were performed in the Examples and Comparative Examples by respective methods as described below.

[Measurement and Evaluation Methods]

<Calculation of Area Ratio (X/Y)>

First, sodium carbonate and sodium hydrogen carbonate were added to a mixed solvent which was a mixture of water (ultrapure water) and methanol with a water:methanol volume ratio of 8:2, so as to adjust the respective solids contents to 20 mmol/L and 30 mmol/L, to thereby obtain an eluent. The obtained eluent had a pH of 10.8 at 25° C.

A purified mixed solution containing the conductive polymer (A) and the basic compound (B) was dissolved in the eluent so as to adjust the solids content of the conductive polymer (A) to 0.1% by mass, thereby preparing a test solution (step (i)).

For the obtained test solution, the molecular weight distribution was measured using a polymer material evaluation device ("Waters Alliance 2695, 2414 (refractive index meter), 2996 (PDA)", manufactured by Waters Corporation) equipped with a gel permeation chromatograph to which a photodiode array (PDA) detector was connected, thereby obtaining a chromatogram (step (ii)).

Then, the retention times were converted into the sodium polystyrene sulfonate-equivalent molecular weight values (M) with respect to the obtained chromatogram (step (iii)). Specifically, sodium polystyrene sulfonate samples having peak top molecular weights of 206, 4300, 6800, 17000, 32000, 77000, 15000 and 2600000 were used as reference samples, which were respectively dissolved in an eluent in the same manner as in the preparation of the test solution so as to adjust the respective solids contents to 0.05% by mass except that the solids content of the reference sample having a peak top molecular weight of 206 was adjusted to 0.0025% by mass, thereby preparing reference solutions. With respect to the reference solutions, the relationships between the retention times and the molecular weights were obtained by GPC, to prepare a calibration curve. From the prepared calibration curve, the retention times of the chromatogram obtained in the step (ii) were converted to the sodium polystyrene sulfonate-equivalent molecular weights (M).

Then, an area (X) of a region corresponding to molecular weight values (M) ranging from 300 to 3300 and an area (Y) of an entire region ascribed to the conductive polymer (A) were determined (step (iv), step (v)).

The area ratio (X/Y) between the area (X) and the area (Y) was determined (step (vi)).

<Calculation of ZS/ZR>

A measurement solution obtained by diluting the conductive composition with water so as to adjust the solids content of the conductive polymer (A) to 0.6% by mass was placed in a surface fluorescence measurement cell (triangular cell), and the fluorescence spectrum was obtained using a spectrofluorometer under the following measurement condition 1. The obtained fluorescence spectrum was separately corrected by a device function obtained using Rhodamine B for a spectrofluorometer. For the corrected fluorescence spectrum, the maximum value (ZS) of the fluorescence intensity of the measurement solution was obtained from the maximum peak height in the wavelength region of 320 to 420 nm.
(Measurement Condition 1)
  Measuring device: spectrofluorometer ("FP-6500", manufactured by JASCO Corporation)
  Excitation wavelength: 230 nm
  Fluorescence measurement wavelength: 250-450 nm
  Bandwidth: 10 nm on the excitation side, 5 nm on the fluorescence side
  Response: 2 sec
  Scanning speed: 100 nm/min Then, water was placed in a surface fluorescence measurement cell (triangular cell), and the fluorescence spectrum was obtained using a spectrofluorometer under the following measurement condition 2. The obtained fluorescence spectrum was separately corrected by a device function obtained using Rhodamine B for a spectrofluorometer. For the corrected fluorescence spectrum, the maximum value (ZR) of the Raman scattering intensity of the water was obtained from the maximum peak height in the wavelength region of 380 to 420 nm.

ZS/ZR was determined by dividing ZS by ZR.
(Measurement Condition 2)
  Excitation wavelength: 350 nm
  Fluorescence measurement wavelength: 350-450 nm
  Bandwidth: 10 nm on the excitation side, 5 nm on the fluorescence side
  Response: 2 sec
  Scanning speed: 100 nm/min <Evaluation of Contaminants Generation>

A conductive composition was spin-coated (1000 rpm×180 sec) on an 8-inch silicon wafer as a substrate, and the resulting was heated on a hot plate at 80° C. for 2 minutes, thereby obtaining a test piece having a coating film (film thickness 20 nm) formed on the substrate.

The obtained test piece was observed with a microscope (magnification: 1000 times) using an SEM linked with an optical wafer appearance inspection device ("SR-7300" manufactured by Hitachi High-Technologies Corporation), and the number ($\alpha$) of contaminants generated per 1 mm$^2$ of the coating film was measured.

Similarly, for the 8-inch silicon wafer before coating with the conductive composition, the number ($\beta$) of contaminants present per 1 mm$^2$ of the substrate was measured in advance, and the number ($\alpha-\beta$) of contaminants derived from the conductive composition was determined, based on which the contaminants generation was evaluated according to the following evaluation criteria.

A: The number of contaminants derived from the conductive composition is 10 or less.
  B: The number of contaminants derived from the conductive composition is 11 to 20.
  C: The number of contaminants derived from the conductive composition is 21 or more.

<Measurement of Surface Resistivity>

A test piece was prepared in the same manner as in the evaluation of contaminants generation.

The surface resistivity of the obtained test piece was measured by mounting a serial 4-pin probe on a resistivity meter ("Loresta GP" manufactured by Mitsubishi Chemical Analytech Co., Ltd.).

[Production of Conductive Polymer (A)]

Production Example 1: Production of Conductive Polymer (A-1)

10 mol of 3-aminoanisole-4-sulfonic acid was dissolved in 5820 mL of a 4 mol/L pyridine solution (solvent: water/acetonitrile=3/7 (mass ratio)) at 40° C. to obtain a monomer solution.

Separately, 10 mol of ammonium peroxodisulfate was dissolved in 8560 mL of a solution of water/acetonitrile=3/7 (mass ratio) to obtain an oxidizing agent solution.

Then, the monomer solution was added dropwise to the oxidizing agent solution while cooling the oxidizing agent solution to 5° C. After completion of the dropwise addition, the mixture was further stirred at 25° C. for 15 hours, then heated to 35° C. and further stirred for 2 hours to obtain a conductive polymer. Then, the resulting reaction mixture containing the conductive polymer was filtered by a centrifugal filter. Further, the obtained conductive polymer was washed with methanol and then dried to obtain 433 g of a powdery conductive polymer (A-1).

Production Example 2: Production of Conductive Polymer Solution (A1-1)

20 g of the conductive polymer (A-1) obtained in Production Example 1 was dissolved in 980 g of pure water to obtain 1000 g of a conductive polymer solution (A-1-1) having a solids concentration of 2% by mass.

500 mL of a cation exchange resin ("Amberlite IR-120B" manufactured by Organo Corporation) washed with ultrapure water was filled into a column.

1000 g of the conductive polymer solution (A-1-1) was passed through this column at a rate of 50 mL/min (SV=6) to collect 900 g of the conductive polymer solution (A1-1-1) from which the basic substance and the like had been removed.

Next, the column was filled with 500 mL of an anion exchange resin ("Amberlite IRA410" manufactured by Organo Corporation) washed with ultrapure water.

900 g of the conductive polymer solution (A1-1-1) was passed through this column at a rate of 50 mL/min (SV=6) to collect 800 g of the conductive polymer solution (A1-1) from which the basic substance and the like had been removed.

The composition of the conductive polymer solution (A1-1) was analyzed by ion chromatography. As a result, it was found that 80% by mass of the residual monomers, 99% by mass of the sulfate ions, and 99% by mass or more of the basic substance (pyridine) had been removed. Further, the non-volatile content was measured and found to be 2.0% by mass. That is, the solids content of the conductive polymer solution (A1-1) was 2.0% by mass.

In this context, 1 sverdrup (SV) is defined as $1\times10^6$ m$^3$/s (1 GL/s).

[Production of Surfactant (C)]

Production Example 3: Production of Water-Soluble Polymer (C-1) Having Nitrogen-Containing Functional Group and Terminal Hydrophobic Group 55 g of N-vinyl-2-pyrrolidone, 3 g of azobisisobutyronitrile as a polymerization initiator, and 1 g of n-dodecyl mercaptan as a chain transfer agent were added dropwise to isopropyl alcohol which had been preheated to an internal temperature of 80° C., while maintaining the internal temperature at 80° C., thereby implementing a drop polymerization. After completion of the dropping, the resulting was aged at an internal temperature of 80° C. for another 2 hours, allowed to cool, concentrated under reduced pressure, and redissolved in a small amount of acetone. A white precipitate obtained by dropping the acetone solution of the obtained polymer onto excess amount of n-hexane was filtered off, washed, and dried to obtain 45 g of a water-soluble polymer (C-1).

Example 1

100 parts by mass of the conductive polymer solution (A1-1) (2 parts by mass in terms of solids content (corresponding to $3.1 \times 10^{-3}$ mol)) was heated to 70° C., followed by addition of 90 parts by mass of tetrabutylammonium hydroxide (TBAH) as the basic compound (B) while stirring, thereby obtaining a mixed solution (conductive polymer-containing solution). The obtained mixed solution was continuously heated so as to maintain the temperature of the mixed solution at 70° C., and the mixed solution was stirred for 2 hours from the start of addition of the basic compound (B) (heating step).

The amount of the basic compound (B) added corresponds to 0.40 mol equivalent with respect to 1 mol of the unit having an acidic group among the units constituting the conductive polymer (A).

Next, the heated mixed solution was left to stand at room temperature for 60 minutes, and then 50 g of the mixed solution was passed through a filter under a constant pressure of 0.05 MPa using a pressure filtration device (purification step). As the filter, a nylon filter (Ny-10 nm) having a pore size of 10 nm was used.

A part of the obtained filtrate (purified mixed solution) was collected and dissolved in the eluent prepared in advance so as to adjust the solids content of the conductive polymer (A) to 0.1% by mass, thereby preparing a test solution. The area ratio (X/Y) was calculated for this test solution. The results are shown in Table 1.

Separately, a part of the obtained filtrate (purified mixed solution) was collected, and the fluorescence intensity was measured to determine ZS/ZR. The results are shown in Table 1.

Next, 1 part by mass of the water-soluble polymer (C-1) and 89 parts by mass of isopropyl alcohol as the solvent (D) were added to 10 parts by mass of the purified mixed solution to obtain a conductive composition.

Using the obtained conductive composition, the contaminants generation was evaluated. The results are shown in Table 1. Further, the surface resistivity was measured. The results are shown in Table 1.

Example 2

The heating step was performed in the same manner as in Example 1.

Next, the heated mixed solution was left to stand at room temperature for 60 minutes, and then 10 parts by mass of a strongly basic anion exchange resin ("Orlite DS-2", manufactured by Organo Corporation) was added to the unpurified mixed solution. The resulting was rotated at room temperature for 1 hour at a rotation speed of 50 rpm using a rotor variable (VMR-3R). Then, the strongly basic anion exchange resin was removed by filtering the mixed solution with a filter having a pore size of 0.45 μm (purification step).

A part of the obtained filtrate (purified mixed solution) was collected, and the area ratio (X/Y) was calculated in the same manner as in Example 1. The results are shown in Table 1.

Separately, a part of the obtained filtrate (purified mixed solution) was collected, and the fluorescence intensity was measured to determine ZS/ZR. The results are shown in Table 1 and FIG. 2.

Further, a conductive composition was prepared in the same manner as in Example 1 except that the obtained purified mixed solution was used, and the generation of contaminants was evaluated. The results are shown in Table 1. Further, the surface resistivity was measured. The results are shown in Table 1.

Example 3

The heating step was performed in the same manner as in Example 1.

Separately, 10 g of a synthetic adsorbent ("Sepabeads SP850", manufactured by Mitsubishi Chemical Corporation) was weighted and put into a PP cup, and rinsed 8 times with 50 g of ultrapure water (Millipore).

Next, the heated mixed solution was left to stand at room temperature for 60 minutes, and then 20 g of the unpurified mixed solution was added to the rinsed synthetic adsorbent so as to adjust the solids content of the rinsed synthetic adsorbent to 2.0% by mass. The resulting was rotated at room temperature for 1 hour at a rotation speed of 150 rpm using a slim stirrer. Then, the synthetic adsorbent was removed by filtering the mixed solution with a filter having a pore size of 0.45 μm (purification step).

A part of the obtained filtrate (purified mixed solution) was collected, and the area ratio (X/Y) was calculated in the same manner as in Example 1. The results are shown in Table 1.

Separately, a part of the obtained filtrate (purified mixed solution) was collected, and the fluorescence intensity was measured to determine ZS/ZR. The results are shown in Table 1.

Further, a conductive composition was prepared in the same manner as in Example 1 except that the obtained purified mixed solution was used, and the generation of contaminants was evaluated. The results are shown in Table 1. Further, the surface resistivity was measured. The results are shown in Table 1.

Comparative Example 1

The heating step was performed in the same manner as in Example 1.

After the heated mixed solution was allowed to stand at room temperature for 60 minutes, a part of the unpurified mixed solution was sampled, and the area ratio (X/Y) was calculated in the same manner as in Example 1. The results are shown in Table 1.

Separately, a part of the obtained filtrate (purified mixed solution) was collected, and the fluorescence intensity was measured to determine ZS/ZR. The results are shown in Table 1 and FIG. 2.

Further, a conductive composition was prepared in the same manner as in Example 1 except that the obtained unpurified mixed solution was used, and the generation of contaminants was evaluated. The results are shown in Table 1. Further, the surface resistivity was measured. The results are shown in Table 1.

TABLE 1

| | Purification step | Area ratio (X/Y) | ZS/ZR | Surface resistivity [Ω/sq.] | Contaminants generation Number | Evaluation |
|---|---|---|---|---|---|---|
| Example 1 | Ny-10 nm | 0.019 | 4.1 | $7.5 \times 10^8$ | 10 | A |
| Example 2 | Anion exchange | 0.019 | 2 | $5.8 \times 10^8$ | 9 | A |
| Example 3 | Synthetic adsorbent | 0.008 | 0 | $6.0 \times 10^8$ | 5 | A |
| Comparative Example 1 | None | 0.047 | 22.7 | $9.8 \times 10^8$ | 28 | C |

Figure 2:
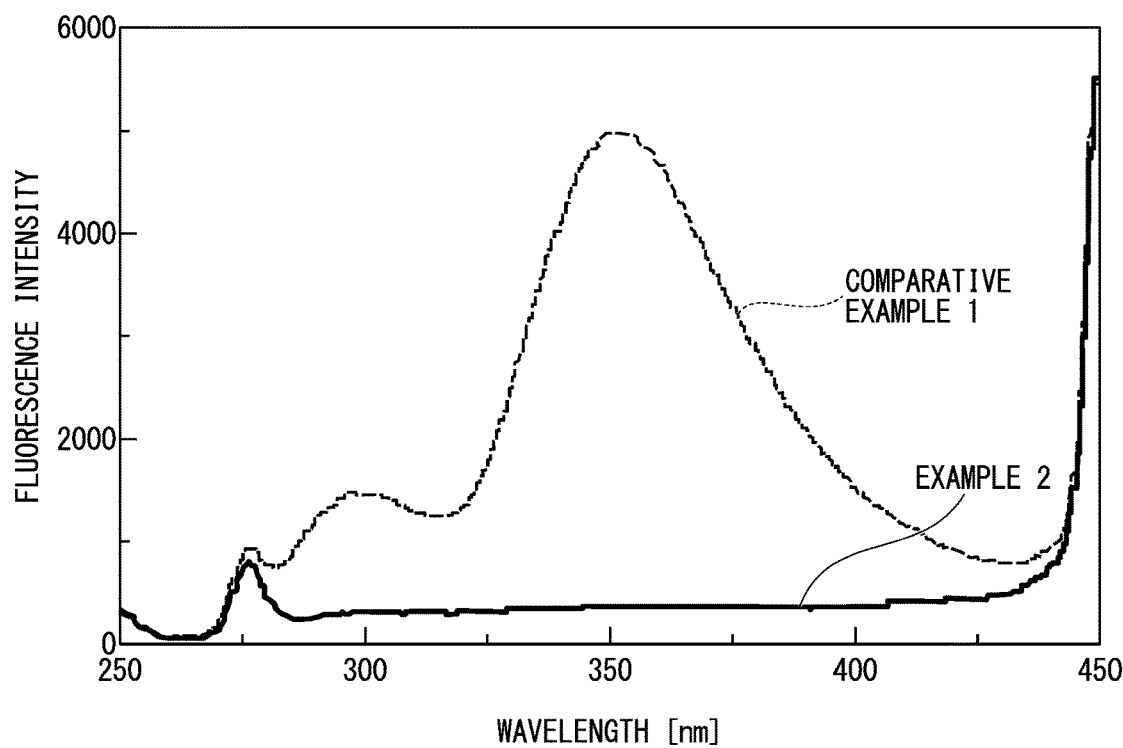
FIG. 2 shows fluorescence spectra in Example 2 and Comparative Example 1.

As is clear from Table 1 and FIG. 2, the defect factor components in the conductive compositions obtained in the Examples were sufficiently reduced. Further, in the coating films formed from the conductive compositions obtained in the Examples, the contaminants generation was suppressed.

On the other hand, the conductive composition obtained in Comparative Example 1 contained a large amount of defect factor components as compared to the Examples, and the number of contaminants generated in the coating film was also larger than those in the Examples.

INDUSTRIAL APPLICABILITY

The conductive composition of the present invention is advantageous in that defect factor components are sufficiently reduced, and the conductive composition can form a conductive film with less resist loss of a resist layer and having excellent conductivity; therefore, the conductive composition of the present invention is useful for making resists antistatic.

The invention claimed is:

1. A conductive composition, comprising:
a purified mixture of a conductive polymer (A) and a basic compound (B), wherein the conductive polymer (A) comprises, in polymerized form, in a range of from 20 to 100 mol. % relative to all repeating units, phenylene vinylene, vinylene, thienylene, pyrrolylene, phenylene, iminophenylene, isothianaphthene, furylene, and/or carbazolylene, each having its α position or β position substituted with at least one group selected from the group consisting of a sulfonic acid group and a carboxylic acid group, wherein the basic compound (B) comprises a quaternary ammonium compound (b-1), a basic compound (b-2) comprising a nitrogen atom other than the quaternary ammonium compound (b-1), and/or a basic compound (b-3) comprising a basic group, a first hydroxy group, and a second hydroxy group in the same molecule, and having a melting point of 30° C. or higher,
wherein the basic compound (B) is present in the conductive composition in a range of from 0.1 to 1 mol equivalent, with respect to 1 mol of units having an acidic group in the conductive polymer (A),
wherein the conductive polymer (A) is at least partially neutralized with the basic compound (B) and forms a salt between the sulfonic acid group and/or carboxylic acid group and the basic compound (B),
wherein an X/Y area ratio is 0.046 or less as calculated by an evaluation method comprising:
(I) preparing a test solution by dissolving the conductive composition in an eluent having a pH adjusted to 10 or more so as to adjust a solids content of the conductive polymer (A) to 0.1% by mass,
(II) measuring a molecular weight distribution of the test solution using a polymer material evaluation device equipped with a gel permeation chromatograph to obtain a chromatogram,
(III) converting retention times into sodium polystyrene sulfonate-equivalent molecular weight values (M) with respect to the chromatogram obtained in the measuring (II),
(IV) determining an area (X) of a region corresponding to sodium polystyrene sulfonate-equivalent molecular weight values (M) in a range of from 300 to 3300,
(V) determining an area (Y) of an entire region ascribed to the conductive polymer (A) in terms of the sodium polystyrene sulfonate-equivalent molecular weight values (M), and
(VI) obtaining the X/Y area ratio of the area (X) to the area (Y).

2. The conductive composition of claim 1, wherein a ZS/ZR ratio is 20 or less,
wherein the ZS is a maximum value of fluorescence intensity in a wavelength region in a range of from 320 to 420 nm when a fluorescence spectrum is measured using a spectrofluorometer at an excitation wavelength of 230 nm with respect to a measurement solution obtained by diluting the conductive composition with water so as to adjust a solids content of the conductive polymer (A) to 0.6% by mass, and
wherein the ZR is a maximum value of Raman scattering intensity in a wavelength region in a range of from 380 to 420 nm when a fluorescence spectrum of water is measured using a spectrofluorometer at an excitation wavelength of 350 nm.

3. The conductive composition of claim 1, further comprising:
a surfactant (C); and
a solvent (D).

4. A conductive composition, comprising:
a purified mixture of a conductive polymer (A) and a basic compound (B), wherein the conductive polymer (A) comprises, in polymerized form, in a range of from 20 to 100 mol. % relative to all repeating units, phenylene vinylene, vinylene, thienylene, pyrrolylene, phenylene, iminophenylene, isothianaphthene, furylene, and/or carbazolylene, each having its α position or β position substituted with at least one group selected from the group consisting of a sulfonic acid group and a carboxylic acid group, wherein the basic compound (B) comprises a quaternary ammonium compound (b-1), a basic compound (b-2) comprising a nitrogen atom other than the quaternary ammonium compound (b-1), and/or a basic compound (b-3) comprising a basic group, a first hydroxy group, and a second hydroxy group in the same molecule, and having a melting point of 30° C. or higher,
wherein the basic compound (B) is present in the conductive composition in a range of from 0.1 to 1 mol equivalent, with respect to 1 mol of units having an acidic group in the conductive polymer (A),
wherein the conductive polymer (A) is at least partially neutralized with the basic compound (B) and forms a salt between the sulfonic acid group and/or carboxylic acid group and the basic compound (B),
wherein a ZS/ZR ratio is 20 or less,
wherein ZS is a maximum value of fluorescence intensity in a wavelength region in a range of from 320 to 420 nm when a fluorescence spectrum is measured using a spectrofluorometer at an excitation wavelength of 230 nm with respect to a measurement solution obtained by diluting the conductive composition with water so as to adjust a solids content of the conductive polymer (A) to 0.6% by mass, and wherein ZR is a maximum value of Raman scattering intensity in a wavelength region in a range of from 380 to 420 nm when a fluorescence spectrum of water is measured using a spectrofluorometer at an excitation wavelength of 350 nm.

5. The conductive composition of claim 4, further comprising:
a surfactant (C); and
a solvent (D).

6. A conductor, comprising:
a substrate; and
a coating formed on at least one surface of the substrate by coating the surface with the conductive composition of claim 1.

7. A conductor, comprising:
a substrate; and
a coating formed on at least one surface of the substrate by coating the surface with the conductive composition of claim 4.

8. A method for producing a conductor, the method comprising:
applying the conductive composition of claim 1 to at least one surface of a substrate to form a coating film.

9. A method for producing a conductor, the method comprising:
applying the conductive composition of claim 4 to at least one surface of a substrate to form a coating film.

10. A method for producing a conductive composition, the method comprising:
heat-treating a mixed solution comprising a conductive polymer (A) and a basic compound (B); and
purifying the heat-treated mixed solution so as to obtain a purified mixed solution having a ZS/ZR ratio of 20 or less, or having an X/Y area ratio of 0.046 or less as calculated by an evaluation method comprising:
(i) preparing a test solution by dissolving the purified mixed solution in an eluent having a pH adjusted to 10 or more so as to adjust a solids content of the conductive polymer (A) to 0.1% by mass,
(ii) measuring a molecular weight distribution of the test solution using a polymer material evaluation device equipped with a gel permeation chromatograph to obtain a chromatogram,
(iii) converting retention times into sodium polystyrene sulfonate-equivalent molecular weight values (M) with respect to the chromatogram obtained in the measuring (ii),
(iv) determining an area (X) of a region corresponding to sodium polystyrene sulfonate-equivalent molecular weight values (M) in a range of from 300 to 3300,
(v) determining an area (Y) of an entire region ascribed to the conductive polymer (A) in terms of the sodium polystyrene sulfonate-equivalent molecular weight values (M), and
(vi) obtaining the X/Y area ratio of the area (X) to the area (Y),
wherein the ZS is a maximum value of fluorescence intensity in a wavelength region in a range of from 320 to 420 nm when a fluorescence spectrum is measured using a spectrofluorometer at an excitation wavelength of 230 nm with respect to a measurement solution obtained by diluting the conductive composition with water so as to adjust a solids content of the conductive polymer (A) to 0.6% by mass, wherein the ZR is a maximum value of Raman scattering intensity in a wavelength region in a range of from 380 to 420 nm when a fluorescence spectrum of water is measured using a spectrofluorometer at an excitation wavelength of 350 nm, wherein the conductive polymer (A) comprises, in polymerized form, in a range of from 20 to 100 mol. % relative to all repeating units, phenylene vinylene, vinylene, thienylene, pyrrolylene, phenylene, iminophenylene, isothianaphthene, furylene, and/or carbazolylene, each having its α position or β position substituted with at least one group selected from the group consisting of a sulfonic acid group and a carboxylic acid group, wherein the basic compound (B) comprises a quaternary ammonium compound (b-1), a basic compound (b-2) comprising a nitrogen atom other than the quaternary ammonium compound (b-1), and/or a basic compound (b-3) comprising a basic group, a first hydroxy group, and a second hydroxy group in the same molecule, and having a melting point of 30° C. or higher, wherein the basic compound (B) is present in the conductive composition in a range of from 0.1 to 1 mol equivalent, with respect to 1 mol of units having an acidic group in the conductive polymer (A), and wherein the conductive polymer (A) is at least partially neutralized with the basic compound (B) and forms a salt between the sulfonic acid group and/or carboxylic acid group and the basic compound (B).

11. The method of claim 10, further comprising:
adding a surfactant (C) and a solvent (D) to the purified mixed solution,
wherein the heating is in a range of from 60 to 80° C.

12. The conductive composition of claim 1, further comprising:
methanol, ethanol, isopropyl alcohol, propyl alcohol, butanol, acetone, ethyl isobutyl ketone, ethylene glycol, ethylene glycol methyl ether, propylene glycol, propylene glycol methyl ether, propylene glycol ethyl ether, propylene glycol butyl ether, propylene glycol propyl ether, dimethylformamide, dimethylacetamide, N-methylpyrrolidone, and/or N-ethylpyrrolidone.

13. The conductive composition of claim 1, further comprising:
water.

14. The conductive composition of claim 1, further comprising:
a surfactant (C) in a range of from 5 to 80 parts by mass, with respect to 100 parts by mass in total of the conductive polymer (A), the basic compound (B), and the surfactant (C).

15. The conductive composition of claim 1, wherein the conductive polymer (A) comprises a repeating unit of formula (4):

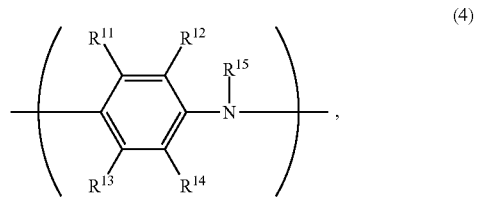

wherein

X is S or N,

R$^1$ to R$^{15}$ are independently H, a linear or branched alkyl group having 1 to 24 carbon atoms, a linear or branched alkoxy group having 1 to 24 carbon atoms, an acidic group, a hydroxy group, a nitro group, a halogen atom, —N(R$^{16}$)$_2$, —NHCOR$^{16}$, —SR$^{16}$, —OCOR$^{16}$, —COOR$^{16}$, —COR$^{16}$, —CHO or —CN, R$^{16}$ being an alkyl group having 1 to 24 carbon atoms, an aryl group having 6 to 24 carbon atoms, or an aralkyl group having 7 to 24 carbon atoms, wherein at least one of R$^{11}$ to R$^{15}$ is the sulfonic acid group or carboxylic acid group.

16. The conductive composition of claim 1, wherein the sulfonic acid group or carboxylic acid group is in salt form.

17. The conductive composition of claim 1, wherein the basic compound (B) comprises tetramethylammonium hydroxide, tetraethylammonium hydroxide, tetrapropylammonium hydroxide, tetrabutylammonium hydroxide, tetrapentylammonium hydroxide, tetrahexylammonium hydroxide, benzyltrimethylammonium hydroxide, ammonia, pyridine, triethylamine, 4-dimethylaminopyridine, 4-dimethylaminomethylpyridine, 3,4-bis(dimethylamino)pyridine, 1,5-diazabicyclo[4.3.0]-5-nonene, 1,8-diazabicyclo[5.4.0]-7-undecene, 2-amino-1,3-propanediol, tris(hydroxymethyl) aminomethane, 2-amino-2-methyl-1,3-propanediol, 2-amino-2-ethyl-1,3-propanediol, 3-[N-tris(hydroxymethyl)methylamino]-2-hydroxypropanesulfonic acid, and/or N-tris(hydroxymethyl)methyl-2-aminoethanesulfonic acid.

18. The conductive composition of claim 1, wherein the conductive polymer (A) is present in the conductive composition in a range of from 0.1 to 20% by mass, and
wherein the basic compound (B) is present in the conductive composition in a range of from 0.25 to 0.85 mol equivalent, with respect to 1 mol of the units having an acidic group in the conductive polymer (A).

19. The conductive composition of claim 18, wherein the conductive polymer (A) is present in a range of from 80 to 99.9% by mass, based on a total mass of solid components of the conductive composition.

20. The conductive composition of claim 1, wherein the X/Y area ratio is in a range of from 0.001 to 0.046.

* * * * *